(12) United States Patent
Barlage et al.

(10) Patent No.: US 11,949,019 B2
(45) Date of Patent: Apr. 2, 2024

(54) THIN FILM SEMICONDUCTOR SWITCHING DEVICE

(71) Applicant: ZINITE CORPORATION, Vancouver (CA)

(72) Inventors: Douglas W. Barlage, Edmonton (CA); Lhing Gem Shoute, Edmonton (CA); Kenneth C. Cadien, Edmonton (CA); Alex Munnlick Ma, Edmonton (CA); Eric Wilson Milburn, Edmonton (CA)

(73) Assignee: ZINITE CORPORATION, British Columbia (CA)

( * ) Notice: Subject to any disclaimer, the term of this patent is extended or adjusted under 35 U.S.C. 154(b) by 0 days.

(21) Appl. No.: 18/384,066

(22) Filed: Oct. 26, 2023

(65) Prior Publication Data

US 2024/0055529 A1    Feb. 15, 2024

Related U.S. Application Data

(63) Continuation of application No. PCT/IB2022/056349, filed on Jul. 8, 2022.

(60) Provisional application No. 63/221,292, filed on Jul. 13, 2021.

(51) Int. Cl.
*H01L 29/00* (2006.01)
*H01L 29/66* (2006.01)
*H01L 29/786* (2006.01)

(52) U.S. Cl.
CPC .. *H01L 29/78618* (2013.01); *H01L 29/66969* (2013.01); *H01L 29/78603* (2013.01); *H01L 29/78642* (2013.01); *H01L 29/7869* (2013.01)

(58) Field of Classification Search
CPC ............ H01L 29/78618; H01L 29/786; H01L 29/66969; H01L 29/66; H01L 29/78603; H01L 29/78642; H01L 29/7869
See application file for complete search history.

(56) References Cited

U.S. PATENT DOCUMENTS

| | | | |
|---|---|---|---|
| 10,224,429 B2* | 3/2019 | Bu | H01L 29/66356 |
| 10,790,356 B2* | 9/2020 | Lee | H01L 21/02527 |
| 2016/0315196 A1 | 10/2016 | Barlage et al. | |
| 2017/0365714 A1* | 12/2017 | Bu | H01L 29/66356 |
| 2019/0043946 A1* | 2/2019 | Lee | H01L 29/0847 |

FOREIGN PATENT DOCUMENTS

| WO | WO-2011055620 A1 | 5/2011 |
|---|---|---|
| WO | WO-2020167658 A1 | 8/2020 |

OTHER PUBLICATIONS

Ares et al., Piezoelectricity in Monolayer Hexagonal Boron Nitride, 2020, vol. 32, pp. 1905504 (Year: 2020).*

* cited by examiner

*Primary Examiner* — Nikolay K Yushin
(74) *Attorney, Agent, or Firm* — PERRY + CURRIER INC.

(57) ABSTRACT

Novel semiconductor devices are taught. The novel devices include a thin film transistor (TFT) with an n-type semiconductor layer to form a channel between a source and a drain. The TFT further includes a source-channel interfacial member adjacent to at least the source contact of the device to provide depletion layer control of the operation of the TFT.

30 Claims, 37 Drawing Sheets

THIN FILM SEMICONDUCTOR SWITCHING DEVICE

PRIORITY

This application is a continuation in part of PCT/IB2022/056349, filed Jul. 8, 2022 claims convention priority benefit from U.S. provisional patent Application 63/221,292, filed Jul. 13, 2021, and the contents of this earlier application are incorporated herein, by reference, in their entirety.

FIELD OF THE INVENTION

The present invention relates to semiconductor devices. More specifically, the present invention relaters to thin film semiconductor switching devices, such as transistors.

BACKGROUND OF THE INVENTION

Thin film semiconductor switching devices, such as thin film transistors (TFTs) are widely employed in a variety of applications.

TFTs are perhaps the most common example of thin film semiconductor switching devices and are three-terminal field effect devices, comprising: a "source"; a "drain"; and a "gate". The gate is the control terminal used to enable or inhibit current flow from the source to the drain depending upon the voltage applied to the gate.

The electrical behavior of a TFT is dictated by the majority charge carrier of the active material, which is usually a semiconductor. The majority charge carriers carry most of the electric charge, or electric current, through the semiconductor. Typically, the majority charge carriers accumulate at the interface of a gate insulator and the semiconductor material to form a "channel" through which the charge carriers can move through the semiconductor material. When the channel is sufficiently conductive from the source to the drain, the TFT is said to be in an 'ON' state and electrical current flows from the source to the drain through the channel.

For a variety of reasons, it is increasingly of interest to manufacture smaller TFTs. However, prior art TFTs do not scale well to smaller dimensions, such as TFTs where the length of the semiconductor through which the channel can form is less than about 1000 nm, and especially those wherein the channel length is less than 200 nm. At or below such dimensions, it becomes difficult to control the TFTs and known TFTs, when formed with small dimensions, have a threshold voltage (the gate voltage point at which the TFT is in an 'ON' state and the channel is formed to conduct current) that occurs at, or below, zero volts so that the TFTs are normally in an 'ON' state. This low (and in many cases, negative) threshold voltage can result in the poor output resistance and overall transistor performance of conventional TFTs manufactured at small dimensions and these TFTs often require a negative voltage to be applied to their gates to achieve an 'OFF' state and reduce leakage currents.

It is desired to have a thin film semiconductor device which can be manufactured with semiconductor/channel lengths less than 1000 nm and which have an inherent enhancement threshold voltage, resulting in devices which are normally in an 'OFF' state and are more readily controlled. Ideally, such devices would also be able to be fabricated as a Back End Of Line ("BEOL") process in semiconductor fabrication.

SUMMARY OF THE INVENTION

It is an object of the present invention to provide a novel thin film semiconductor switching device which obviates or mitigates at least one disadvantage of the prior art.

According to a first aspect of the present invention there is provided a thin film transistor comprising: a substrate; an insulating layer formed on the substrate; a source formed on the insulating layer; a drain formed on the insulating layer and spaced from the source; an n-type semiconductor material formed on the insulating layer and extending between the source and the gate; a source-channel interfacial member electrically connecting at least the source to the semiconductor material; a gate dielectric layer formed over the semiconductor layer; and a gate formed over the dielectric layer such that, when a positive voltage is applied to the gate, current can flow from the source to the drain through the source-channel interfacial member and through a channel formed in the semiconductor material.

Preferably, the n-type semiconductor material is a metal oxide. More preferably, the n-type semiconductor material is selected from the group comprising zinc oxide, tin oxide, indium gallium zinc oxide, gallium oxide and germanium oxide or combinations thereof.

Also preferably, the source-channel interfacial member is an oxide formed by catalytic growth of the source. Also preferably, the source-channel interfacial member is formed by atomic layer deposition. Also preferably, when source-channel interfacial member is an oxide formed by catalytic growth, the oxygen preferentially traverses to the source-channel interface, creating the source-channel interfacial member.

According to another aspect of the present invention, there is provided a vertical thin film transistor comprising: a substantially planar substrate; an insulating layer formed on the substrate; a source formed on the insulating layer; a second insulating layer formed on the source, the second insulating layer forming a vertical well having an inner surface; a source-channel interfacial member formed on the inner surface of the vertical well and the source; an n-type semiconductor material formed on the source-channel interfacial member, such that the source is electrically connected to the n-type semiconductor material by the source-channel interfacial member; a gate dielectric layer formed over the n-type semiconductor layer; a gate formed over the dielectric layer; and a drain formed on the insulating layer and in electrical contact with the n-type semiconductor material, wherein when a positive voltage is applied to the gate, current can flow from the source to the drain through the source-channel interfacial member and through a channel formed in the semiconductor material According to another aspect of the present invention, there is provided a vertical thin film transistor comprising: a substantially planar substrate; an insulating layer formed on the substrate; a drain formed on the insulating layer; a second insulating layer formed on the drain and forming a vertical well having an inner surface extending upward from the drain; an n-type semiconductor material formed on inner surface of the well and the drain; a gate dielectric layer formed over the semiconductor layer; a gate formed over the dielectric layer; and a source and a source-channel interfacial member formed on the second insulating layer, the source-channel interfacial member electrically connecting the source to the n-type semiconductor material wherein, when a positive voltage is applied to the gate, current can flow from the source to the drain through the source-channel interfacial member and through a channel formed in the semiconductor material.

According to yet another aspect of the present invention, there is provided a vertical thin film transistor comprising: a substantially planar substrate; an insulating layer formed on the substrate; a drain formed on the insulating layer; a second insulating layer formed on the drain and forming a vertical well having an inner surface extending upward from the drain; an n-type semiconductor material formed on inner surface of the well and the drain; a gate dielectric layer formed over the semiconductor layer; a gate formed over the dielectric layer; and a source and a source-channel interfacial member formed on the second insulating layer, the source-channel interfacial member electrically connecting the source to the n-type semiconductor material wherein, when a positive voltage is applied to the gate, current can flow from the source to the drain through the source-channel interfacial member and through a channel formed in the semiconductor material.

Other features and advantages of the present invention will become apparent from the following detailed description, taken together with the accompanying drawings. It should be understood, however, that the detailed description and the specific examples included therein, while indicating presently preferred embodiments of the application, are given by way of example only, since various changes and modifications within the spirit and scope of the invention, as defined solely by the claims, will be apparent to those skilled in the art.

BRIEF DESCRIPTION OF THE DRAWINGS

For a better understanding of the various embodiments of the present invention described herein, reference will be made to the accompanying drawings. The drawings are not intended to limit the scope of the invention described herein and are not drawn to scale, to improve clarity of understanding of this specification. In the Figures:

FIG. 2b is a top view of the TFT of FIG. 2a;

FIG. 3a is a schematic symbol of the TFT of FIG. 2a;

FIG. 8c is a top view of the TFT of FIG. 8a;

Further aspects and features of the example embodiments described herein will appear from the following description taken together with the accompanying drawings.

DETAILED DESCRIPTION OF THE INVENTION

In the following discussion, like components and elements may be indicated with like reference numbers. Further, as is understood by those of skill in the art, most semiconductor devices are manufactured in a series of steps wherein substantially planar layers of material are formed, portions of those layers subsequently being removed, treated and/or replaced with subsequent layers to obtain the desired semiconductor device. Accordingly, as used herein, the terms "horizontal" and "vertical" are used with respect to the plane of those layers, with horizontal referring to a direction largely parallel to the plane of the layers and vertical referring to a direction largely orthogonal to the plane of the layers. Similarly, the terms "up", "down", "on", "under" or the like are also used with respect to those planar layers.

Further, the manufacturing of those layers and/or features of semiconductor devices described herein is referred to herein as "forming" those layers and/or features and, as will be apparent to those of skill in the art, "forming" is intended to comprise all semiconductor manufacturing techniques suitable and applicable therefor including, without limitation: deposition (chemical, atomic layer, physical vapor, etc.); sputtering; PECVD (Plasma Enhanced Chemical Vapor Deposition); implantation and annealing, oxidation; etc. as will be apparent to those of skill in the art.

Before describing embodiments of the present invention, examples of prior art TFTs will be described, for clarity, with respect to FIGS. 1a through 1e.

Figure 1A:
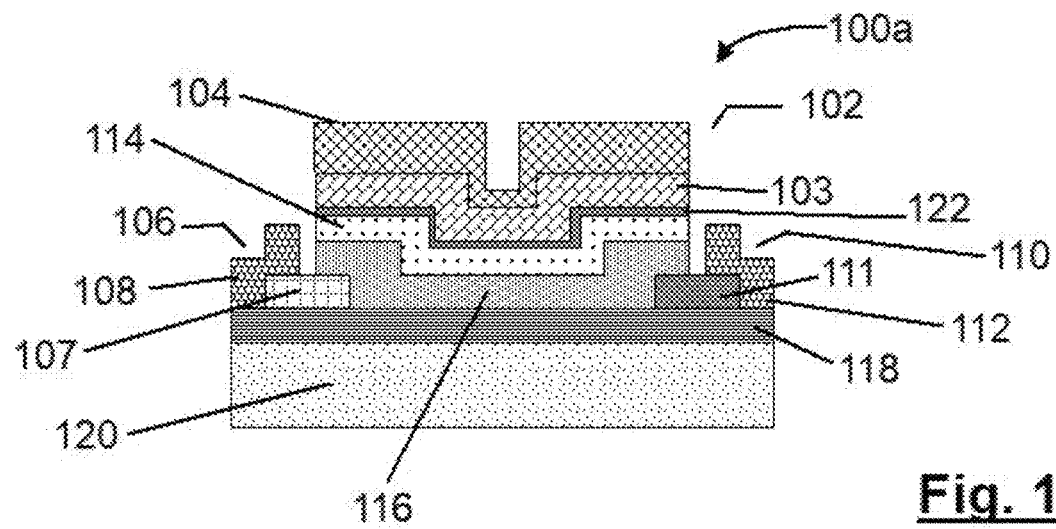
FIGS. 1a, 1b, 1c, 1d and 1e are cross-sectional views of prior art TFTs.

FIG. 1a shows a first example of a prior art TFT which is indicated generally at 100a. TFT 100a consists of a substrate 120 with an insulation layer 118 formed thereon. TFT 100a further includes a gate 102, a source 106 and a drain 110.

Gate 102 includes a gate electrode 104 and a gate contact 103, source 106 includes a source electrode 107 and a source contact 108, and drain 110 includes a drain electrode 111 and a drain contact 112. As will be apparent to those of skill in the art, source electrode 107 and source contact 106 can be the same or different materials. In particular, the material of source contact 106 can be selected to provide a desired Work Function while the material of source electrode 107 can be selected to simplify connection of source electrode 107 to other devices, etc. Gate electrode 104 and gate contact 103, and drain electrode 111 and drain contact 112 can similarly be formed of the same respective materials or different materials, as desired.

TFT 100a also includes a dielectric layer 114 and a semiconductor layer 116. As is understood by those of skill in the art, TFT 100a can optionally include a gate tuning layer 122.

Operation of TFT 100A relies upon the use of semiconductor layer 116 as an active material in which a channel can be formed. When semiconductor 116 is in an active state, a channel is formed between source contact 108 and drain contact 112 allowing electrical current to flow therebetween. In the illustrated embodiment, a n-type semiconductor is shown.

For an n-type semiconductor based TFT (or "n-type TFT"), such as TFT 100a, the TFT will be in an active ('ON') state when a voltage applied to gate 102 (i.e. $V_g$) is greater than the threshold voltage (i.e. $V_{th}$), the threshold voltage being defined by the structure and materials of TFT 100a. In a TFT with an n-type semiconductor, the application of a positive gate voltage greater than the threshold voltage results in the injection of negatively charged electrons into the n-type semiconductor from the source. Upon application of a voltage between the source and the drain (i.e. $V_d$), the injected electrons move through the channel formed in the semiconductor, from the source to the drain, resulting in current flow, i.e. the source-drain current ($I_{ds}$) or drain current ($I_d$).

Figure 1B:
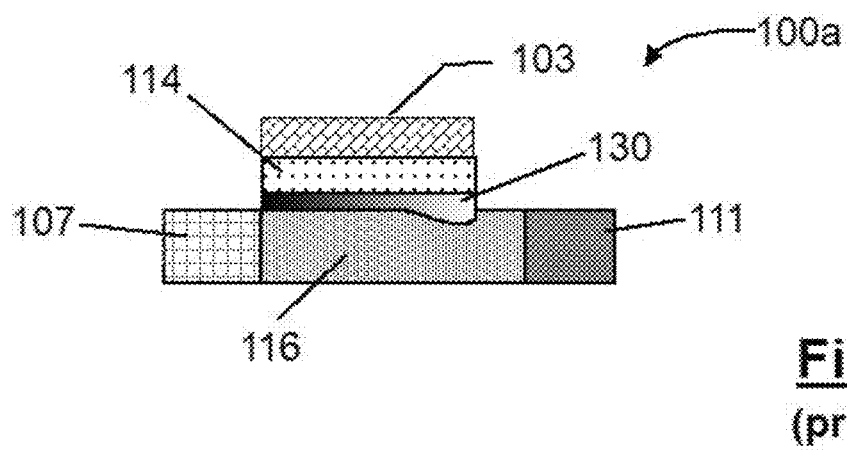

In FIG. 1b, which shows the relevant portions of interest of TFT 100a in more detail, an accumulation layer 130 is illustrated. Accumulation layer 130 is illustrated with a gradient, showing the varying concentration of electrons along the channel through semiconductor layer 116, where the higher concentration of electrons (indicated by the darker color of accumulation layer 130) is closer to source contact 107 than drain contact 111.

Figure 1C:
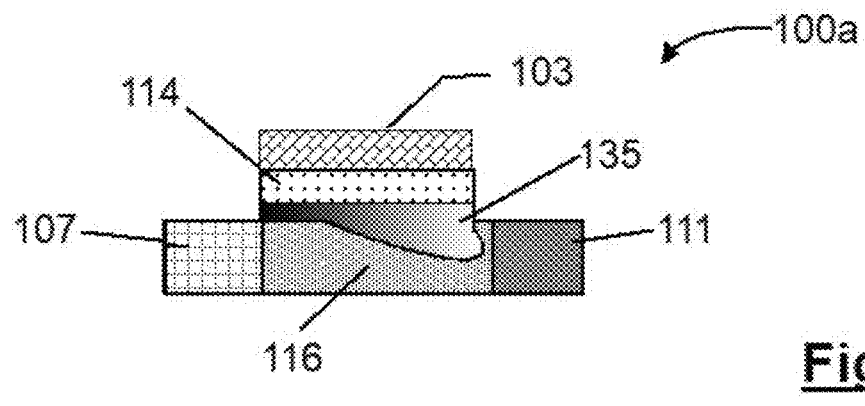

When a low (compared to the gate voltage) drain voltage is applied, the concentration of the carriers in the channel tends to be uniform across the channel and TFT 100a is considered to be "ohmic". When a high drain voltage is applied, the channel becomes "pinched-off" and a highly insulating region adjacent to drain contact 111 begins to form a depletion layer 135, showing a decrease in the density of the carriers, is shown in FIG. 1c.

Conventional TFTs typically have two channels of current flow. A first channel is formed through an ohmic connection between source contact 107 and drain contact 111, and a second channel is formed by an accumulation layer at the interface between gate dielectric layer 114 and semiconductor layer 116.

Because of the channel available underneath gate contact 103, TFT 100a has a limited 'OFF' state due to current flow through this channel. Accordingly, conventional TFTs invariably do not "pinch-off" well, and subsequently can have substantial leakage problems wherein some current flow continues despite the TFT being intended to be "OFF".

Conventional TFTs can also have output resistance problems if source contact 107 and drain contact 111 are too close to one another. For example, as mentioned above, if source contact 107 and drain contact 111 are less than about 1000 nm apart, and particularly if they are less than 200 nm apart, significant levels of leakage occurs. Accordingly, conventional TFTs are typically in an 'ON' state even under a zero-bias. In most cases, a negative gate voltage must be applied to conventional TFTs to create a depletion layer or region in order to limit the flow of current between source contact 107 and drain contact 111 to effectively turn the TFT "OFF".

Figure 1D:
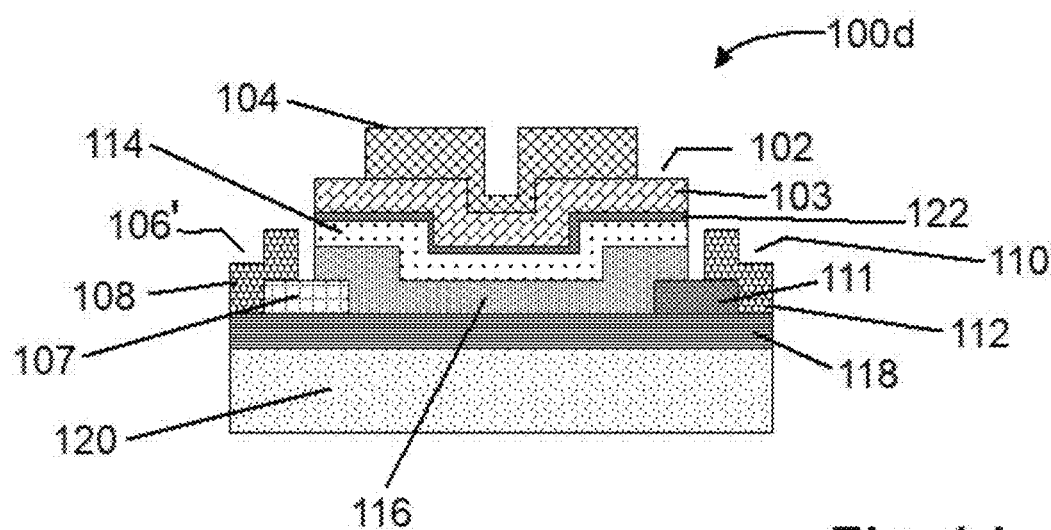

FIG. 1d shows a source gated TFT 100d. TFT 100d is analogous to TFT 100a with the exception that source 106' of TFT 100d is made of a Schottky metal whereas source 106 and drain 110 of TFT 100a are ohmic contacts. In some cases, TFT 100d may also differ from TFT 100a based on the method of manufacture, the semiconductor material, or both. TFT 100d can utilize the asymmetry in the source 106' and drain 110 to increase conductivity between source 106' and drain 110.

Figure 1E:
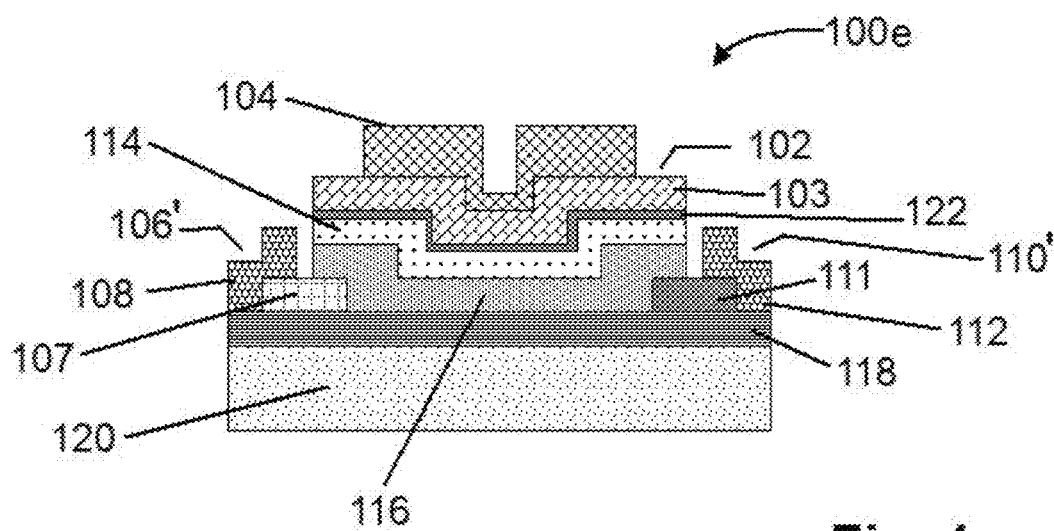

FIG. 1e shows another type of a source gated TFT 100e. TFT 100e is analogous to TFT 100a with the exception that both source 106' and drain 110' of TFT 100e are made of Schottky metals. In contrast to TFT 100d, TFT 100e utilizes a symmetry in source contact 106' and drain contact 110'.

However, both TFT 100d and 100e face similar challenges as those described above with respect to TFT 100a, particularly when fabricated in smaller dimensions.

Figure 2A:
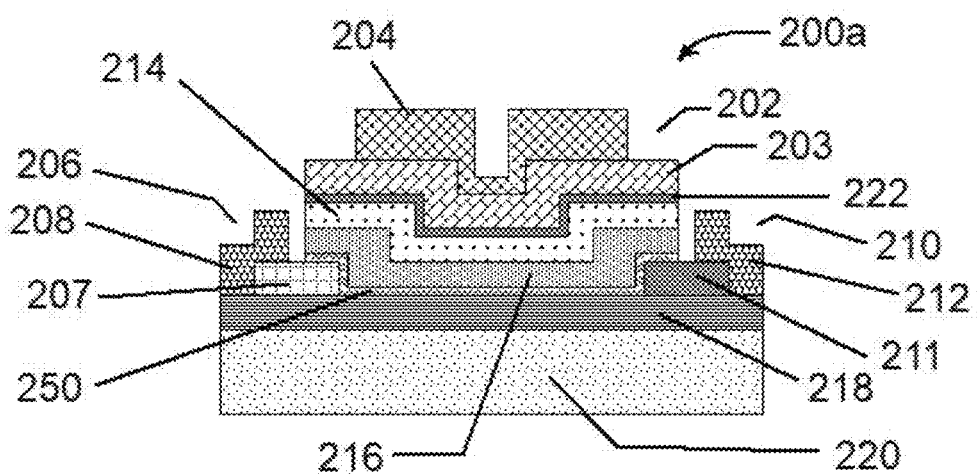
FIG. 2a is a cross-sectional view, taken along line A-A of FIG. 2b, of a TFT in accordance with an embodiment of the present invention.
Figure 2B:
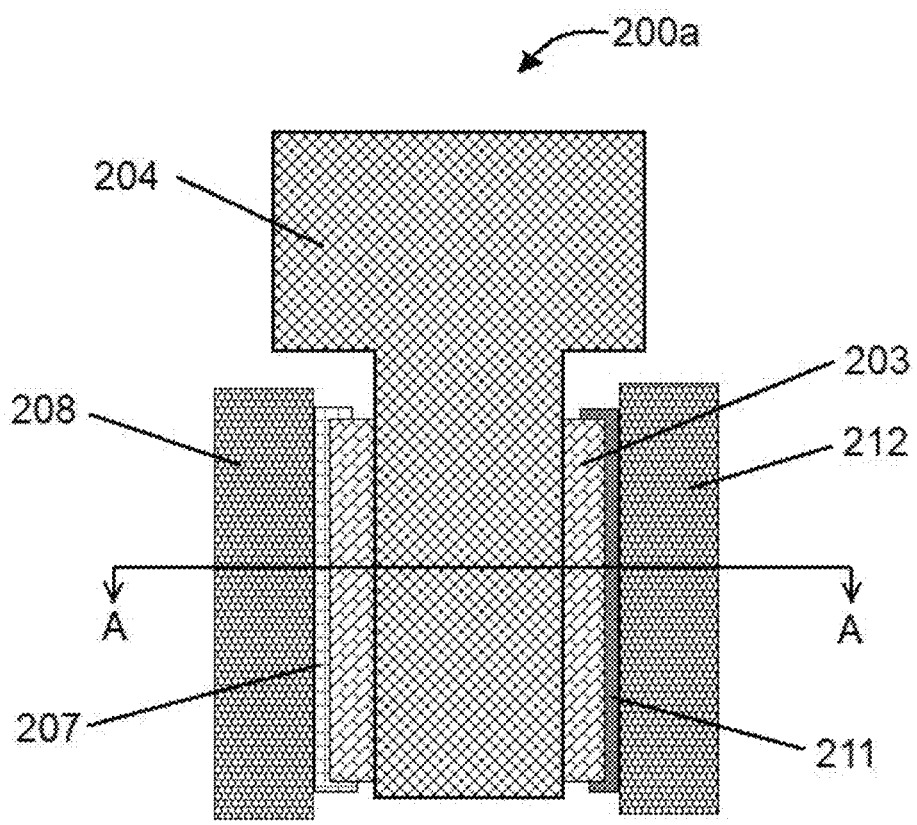

FIG. 2a shows a cross-sectional view of a TFT 200a, taken along line 2A-2A of FIG. 2b, according to an embodiment of the present invention. As shown, TFT 200a includes a gate 202, a source 206 and a drain 210. Gate 202 includes a gate electrode 204 and a gate contact 203, source 206 includes a source electrode 208 and a source contact 207 and drain 210 includes a drain electrode 212 and a drain contact 211. Similar to the case of conventional TFT 100a described above, the electrodes and contacts of each of these features can respectively be formed of the same materials, or the materials can be separately selected, as desired. For example, source contact 207 can be formed from a material selected for its desired Work function while source electrode 208 can selected from a material better suited to connection to other components of a circuit, such as metallization layers, etc.

TFT 200a also includes a dielectric layer 214 and a semiconductor layer 216. TFT 200a can optionally include a gate tuning layer 222. These layers, and TFT 200a in general, are formed over an insulation layer 218, which is formed over a substrate 220. It is contemplated that in many circumstances substrate 220 will be a silicon wafer, as commonly used in the manufacture of semiconductors, however the present invention is not so limited and substrate 220 can, in fact, be a wide variety of materials including, without limitation: glass; ceramics; metals; flexible polymers or other plastics; etc.

In the illustrated embodiment, semiconductor layer 216 is an n-type semiconductor layer. N-type semiconductor layer 216 is a semiconductor material which is selected to preferably allow it to be formed at temperatures below 300 degrees centigrade. Examples of suitable materials for semiconductor layer 216 include, without limitation, zinc oxide, tin oxide, indium gallium zinc oxide, gallium oxide, germanium oxide, etc.

Unlike prior art TFTs, TFT 200a further includes a source-channel interfacial member 250 that, in this embodiment, is a layer of p-type semiconductor material extending from source contact 207 to drain contact 211 under semiconductor layer 216. Source-channel interfacial member 250 electrically connects source contact 207 to semiconductor layer 216 and source contact 207 is otherwise electrically separated from semiconductor layer 216. Further, in this example, source-channel interfacial member 250 electrically connects semiconductor layer 216 to drain contact 211.

Gate contact 203 can comprise any elemental material or compound of materials with conducting properties. Examples of materials that can be used for gate contact 203 include titanium, titanium nitride, chrome, hafnium, tantalum nitride or any other single element or bi-metal element or compound. Gate electrode 204 can be formed of the same material as gate contact 203 or from another material which provides desired properties for connecting gate electrode 204 to other components.

Source 206 and drain 210 can comprise any elemental material or compound of materials with conducting properties. Specifically, source contact 207 and drain contact 211 can be a metal or a degenerate (highly doped) semiconductor. Examples of suitable materials that can be used in source contact 207 and/or drain contact 211 include: nickel, tungsten, molybdenum, aluminum; gold; copper; cobalt; ruthenium; titanium nitride; tantalum nitride; silicon; and/or any III-V compound semiconductor with a high conductivity. In some cases, drain contact 211 consists of the same material as source contact 207. In other cases, drain contact 211 consists of a material with a higher conductivity that is capable of providing a reduced barrier to electron transport than the material used in source contact 207.

Source-channel interfacial member 250 is provided to create a repository of complimentary excess negative charge that functions to deplete the channel in at least the region of semiconductor layer 216 adjacent source contact 207. In this manner, source-channel interfacial member 250 serves as an electron transport barrier, resulting in substantially no current flow through semiconductor layer 216 when TFT 200a is in a 'OFF' state.

The operation of source-channel interfacial member 250 can be achieved in a variety of configurations, including a p-type semiconductor, an induced piezoelectric dipole, a controllable tunneling barrier, combinations thereof or other mechanisms to modulate injected current by an external applied field.

For example, when implemented as a p-type semiconductor, source-channel interfacial member 250 can consist of elemental germanium or source-channel interfacial member 250 can be formed by using a p-type dopant in a relevant portion of semiconductor layer 216. In other cases, source-channel interfacial member 250 can consist of an oxide or a sulfide, or another element corresponding to group VI(A) of the periodic table, or the chalcogens, such as oxygen, sulfur, selenium, tellurium or polonium.

Source-channel interfacial member 250 can also be formed by a catalytic growth of the material that forms source contact 207. In such cases, the oxygen can preferentially traverse to the source-channel interface, creating the source-channel interfacial member. In other cases, source-channel interfacial member 250 can be formed by depositing a p-type dopant, such as a p-type metal oxide or another semiconductor, by way of a deposition technique, such as atomic layer deposition, sputtering physical vapor deposition or chemical vapor deposition.

In the embodiment of TFT 200a, source-channel interfacial member 250 has been formed as a continuous member extending from source contact 207 to drain contact 211. While source-channel interfacial member 250 need only be located adjacent source contact 207 to electrically connect source contact 207 and semiconductor layer 216, depending upon the manufacturing processes used to fabricate TFT 200a, source-channel interfacial member 250 can be a formed as a layer extending between source contact 207 and drain contact 211, or adjacent to just source contact 207, or adjacent to each of source contact 207 and drain contact 211.

It can be desired that semiconductor layer 216 is formed with compositional control such that semiconductor layer 216 is heavily n-type near source contact 207 and drain contact 211 to prevent carrier starvation during the 'ON' state of TFT 200a. In other embodiments, semiconductor layer 216 is formed to be heavily n-type near source contact 207, drain contact 211 and gate contact 203 which can allow tuning of the threshold voltage of TFT 200a. Accordingly, the properties of TFT 200a can be controlled based on the location and extent of n-type doping in semiconductor layer 216.

As illustrated in FIG. 2a, dielectric layer 214 separates gate contact 203 from semiconductor layer 216. Dielectric layer 214 impedes the flow of electrons into gate contact 203, allowing electrons to form a channel between source contact 207 and drain contact 211 with a large concentration of electrons. Dielectric layer 214 can consist of materials such as, for example: hafnium oxide (HfO2); zirconium dioxide ($ZrO_2$); silicon dioxide ($SiO_2$); silicon nitride ($Si_3N_4$); or any other suitable material as would occur to those of skill in the art.

TFT 200a can also include an optional gate tuning layer 222. Gate tuning layer 222 can be an atomic layer of metal that is used to adjust the effective barrier height and/or Work function of the gate contact 203, as desired, as will be apparent to those of skill in the art.

In TFT 200a, typically each of gate electrode 204, source electrode 208 and drain electrode 212 are formed of highly conducting metals, such as copper or aluminum, that are used to electrically connect the corresponding electrode to the appropriate elements of the rest of the integrated circuit in which TFT 200a is formed.

TFT 200a also includes an insulation layer 218 formed over substrate 220. Substrate 220 serves as the foundation for the construction of components and devices, such as transistors and integrated circuits, and insulation layer 218 is a dielectric separating substrate 220 from source contact 207 and drain contact 211. Examples of insulation layer 218 include materials such as: silicon dioxide ($SiO_2$); silicon nitride ($Si_3N_4$); aluminum oxide ($Al_2O_3$); etc. and examples of substrate 220 include silicon, glass, plastic materials and/or flexible polymers, printed circuit boards, etc. In some circumstances, such as the case illustrated in FIG. 2a wherein source-channel interfacial member 250 extends between source contact 207 and drain contact 211, and depending upon the material of substrate 220, source-channel interfacial member 250 can also serve as insulation layer 218, in which case it would formed before forming source contact 207 and drain contact 211.

As discussed above, TFT 200a is intended to perform, when compared to prior art TFTs, with improved operating characteristics, and in particular with a higher threshold voltage, especially when fabricated with channel length dimensions of 1000 nm or less.

As described above, source-channel interfacial member 250 serves to create a repository of complimentary excess negative charge that functions to deplete the channel in at least the region of semiconductor layer 216 adjacent source contact 207. In TFTs fabricated in accordance with embodiments of the present invention, such as TFT 200a, the distance between gate contact 203 and source contact 207, through gate dielectric layer 214, semiconductor layer 216 and source-channel interfacial member 250, is selected such that the electric field induced by a voltage applied to gate contact 203 will lower the blocking potential of the repository of complimentary excess negative charge introduced by source-channel interfacial member 250 to place the TFT, such as TFT 200a, into an 'ON' state. In the absence of such an applied gate voltage, the blocking potential results in the TFT being in an 'OFF' state.

TFT 200a can be fabricated with its various elements formed in ranges of thicknesses. As will be apparent to those of skill in the art, the primary limiting factor is that gate contact 203 must be within sufficient electrical proximity to source contact 207 such that the threshold voltage applied to gate 202 serves to effectively reduce the barrier to electron flow into semiconductor layer 216 induced by source-channel interfacial member 250. Failure to induce a sufficient electric field reduces the ability to turn TFT 200a on. This is very similar to the well known criteria for MOSFETs and the like, typically referred to as Ada ($\eta$) factor.

In a first example of TFT 200a, semiconductor layer 216 was formed with a thickness of about 20 nm (dielectric constant of about 8) and source-channel interfacial member 250 with a thickness of about 2 nm (dielectric constant of about 10) and dielectric layer 214 with a thickness of about 10 nm (dielectric constant of about 24).

In another example of TFT 200a, semiconductor layer 216 was formed with a thickness of about 5 nm (17 dielectric constant), source-channel interfacial member 250 formed was with a thickness of about 0.5 nm (dielectric constant of about 10) and dielectric layer 214 was formed with a thickness of about 5 nm (dielectric constant about 24).

Figure 2C:
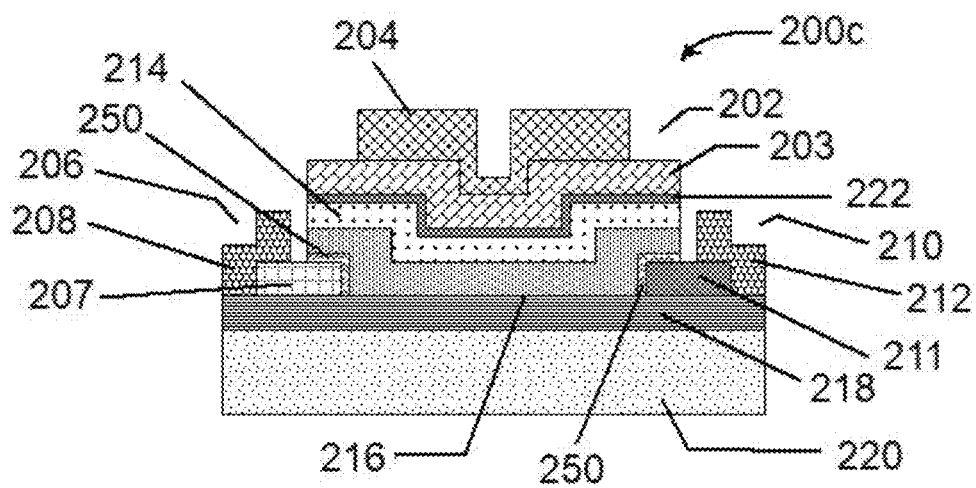
FIG. 2c is a cross-sectional view of a TFT in accordance with another embodiment of the present invention.

The actual selection of the vertical thickness of each of semiconductor layer 216, dielectric layer 214 and source-channel interfacial member 250 will be, to some extent, dependent upon properties of the materials selected and the fabrication techniques employed. However, in view of the disclosure herein, these specific selections will now be well within the capabilities of those of ordinary skill in the art, FIG. 2c illustrates a cross-sectional view of a TFT 200c according to another embodiment of the present invention. In TFT 200c, source-channel interfacial member 250 is not a continuous layer extending between source contact 207 and drain contact 211 and is instead only formed at each of source contact 207 and drain contact 211. In TFT 200c source-channel interfacial member 250 can be formed by a catalytic growth of a metal that forms the source contact 207 and drain contact 211. In some cases, source-channel interfacial member 250 consists of an oxide or a sulfide, or another element corresponding to group VI(A) of the periodic table, or the chalcogens.

Figure 2D:
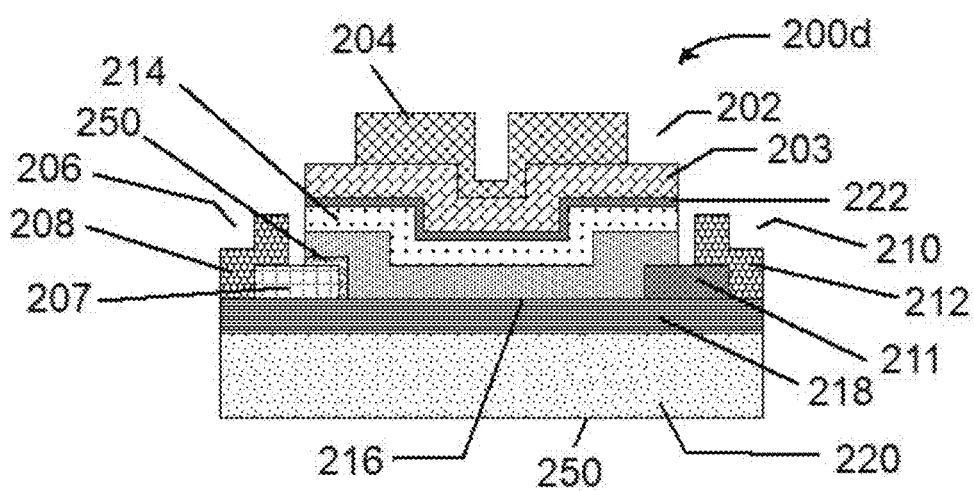
FIG. 2d is a cross-sectional view of a TFT in accordance with another embodiment of the present invention.

FIG. 2d illustrates a cross-sectional view of another TFT 200d according to another embodiment of the present invention. In TFT 200d source-channel interfacial member 250 is formed only at source contact 207 and can be formed by catalytic growth of a metal that makes up source contact 207. In this case, the material making up drain contact 211 can have been selected such that it is "noble", meaning that it does not interact readily with oxidizing agents. Source-channel interfacial member 250 can consist of an oxide or a sulfide, or another element corresponding to group VI(A) of the periodic table, or the chalcogens.

The presence or absence of source-channel interfacial member 250 on drain contact 211 does alter the electrical properties of TFT 200c. In TFT 200c, the absence of source-channel interfacial member 250 on drain contact 211 raises the threshold voltage of TFT 200c between approximately 0.1V to 2V, compared to TFT 200a and TFT 200c. In cases where source-channel interfacial member 250 is formed by catalytic growth of an oxide or sulfide, the resulting formation of source-channel interfacial member 250 on drain contact 211 in addition to the formation of source-channel interfacial member 250 on source contact 207 can be readily tolerated and no additional processing is required to remove source-channel interfacial member 250 from drain contact 211, unless it is desired to reduce the threshold voltage.

Reference is next made to FIGS. 3a through 3d, which represent a TFT 300 in accordance with an embodiment of the present invention and its performance in various states of operation. In the following sets of FIGS. 3, 4, and 5, the substrate and insulation layer have been omitted from the Figures for clarity.

In the various embodiments illustrated herein, with source-channel interfacial member 250 adjacent source contact 207 a structure which is functionally similar to a bipolar junction transistor (BJT) is introduced. The TFTs of the embodiments disclosed herein effectively combine a field-effect transistor (FET) architecture with a structure analogous to the emitter of a BJT at the source contact.

These analogous BJT-like structures have their collector and their base tied together either through a direct ionic short or a collection of recombination centers, and the electrons are injected from the emitter-like structure into source contact 207. A schematic representation of a TFT 300 which has source-channel interfacial member 350 at each of a source contact 307 and a drain contact 311, is illustrated schematically in FIG. 3a.

Figure 3A:
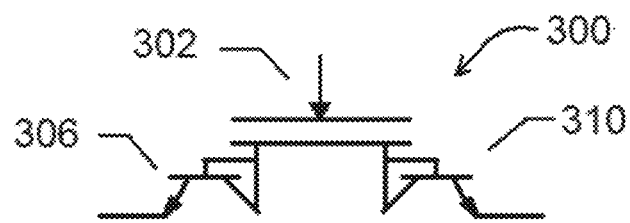
Figure 3B:
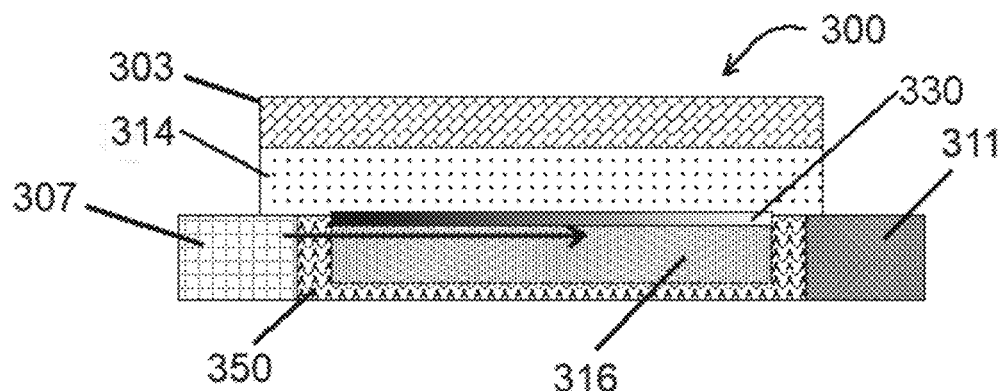
FIG. 3b is a cross-sectional view of a portion of the TFT of FIG. 2a operating in a Forward Active state.
Figure 3C:
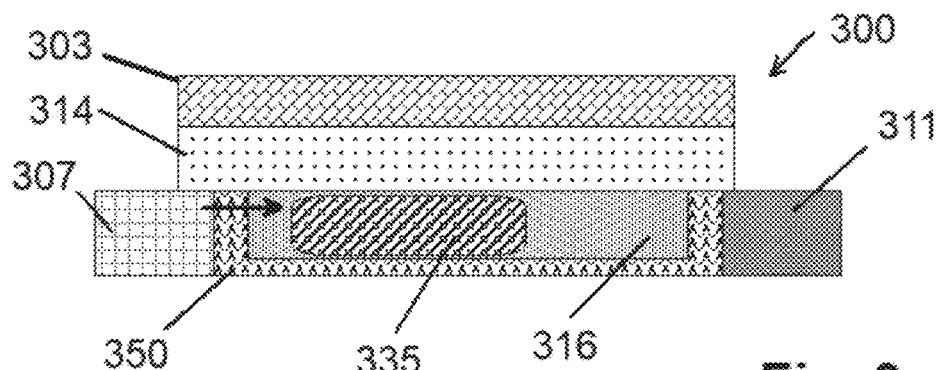
FIG. 3c is a cross-sectional view of a portion of the TFT of FIG. 2a operating in an OFF state.
Figure 3D:
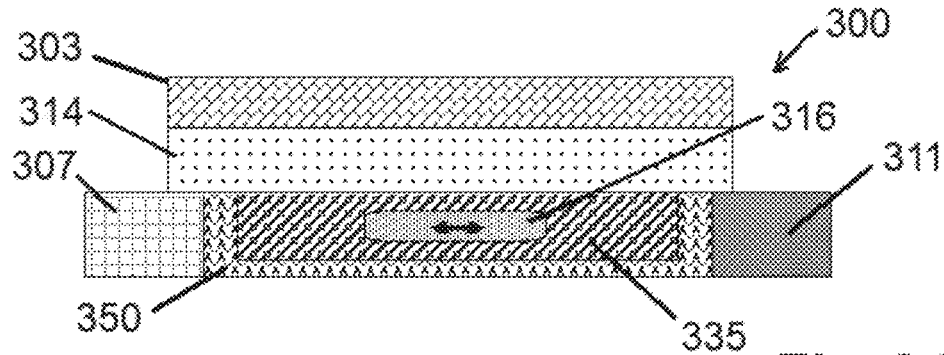
FIG. 3d is a cross-sectional view of a portion of the TFT of FIG. 2a operating in a Zero Voltage state.

FIG. 3b shows a cross section through an instance of TFT 300 when TFT 300 is in the Forward Active state (wherein $V_{DS}>0$ $V_{GS}>.V_{Threshold}$). FIG. 3c shows the cross section of FIG. 3b wherein TFT 300 is in the OFF state (wherein $V_{DS}>0$ $V_{GS}<V_{Threshold}$) and FIG. 3d shows a cross section through an instance of TFT 300 when TFT 300a is in the 0V state (wherein $V_{DS}>0$ $V_{GS}<V_{Threshold}$)

TFT 300 is analogous to TFT 200a of FIG. 2a, and source contact 307, source electrode 306, drain contact 311, drain electrode 310, gate electrode 302, gate contact 303, dielectric layer 314, source-channel interfacial member 350 and n-type semiconductor layer 316 are analogous to the respective elements described above with respect to TFT 200a of FIG. 2a.

In the embodiment of TFT 300, similar to TFT 200a, source-channel interfacial member 350 extends between source contact 307 and drain contact 311, thereby forming a structure resembling a gate limited junction field effect transistor (JFET), or accumulation MOSFET, with a BJT equivalent at source contact 307 and drain contact 311.

FIG. 3b illustrates the operation of TFT 300 in the Forward Active (or 'ON') state. The Forward Active state occurs when the drain voltage ($V_{DS}$) is greater than 0V, and the gate voltage ($V_{GS}$) is greater than the threshold voltage ($V_{Threshold}$). In the Forward Active state, an accumulation layer 330 of electrons forms underneath gate contact 303 below dielectric layer 314. In this state of operation, accumulation layer 330 allows for electron flow from source contact 307 to drain contact 311.

FIG. 3c illustrates TFT 300 in the 'OFF' state mode. TFT 300 enters the 'OFF' state of operation when the gate voltage ($V_{GS}$) is below the threshold voltage ($V_{Threshold}$). In the illustrated embodiment, even with the drain voltage ($V_{DS}$) being greater than 0V, a depletion region 335 is formed in semiconductor layer 316 below gate contact 303 so as to greatly reduce, or substantially eliminate, the flow of electrons between source contact 307 and drain contact 311.

FIG. 3d illustrates TFT 300 in a '0V' state wherein no voltages are applied to TFT 300. When the gate voltage ($V_{GS}$) is at or about 0V, depletion region 335 is more prominent and close to both source contact 307 and drain contact 311, thereby greatly reducing, or substantially eliminating, the flow of electrons between source contact 307 and drain contact 311. This places TFT 300 into an enhanced OFF-state, reducing or substantially eliminating parasitic channels in TFT 300.

Reference is next made to FIGS. 4a through 4d which represent a TFT 400 in accordance with an embodiment of the present invention and its performance in various states of operation. TFT 400 is analogous to TFT 200c of FIG. 2c, and source contact 407, drain contact 411, gate contact 403, dielectric layer 414, source-channel interfacial member 450 and n-type semiconductor layer 416 are analogous to the respective elements described above with respect to TFT 200c of FIG. 2c.

Figure 4A:
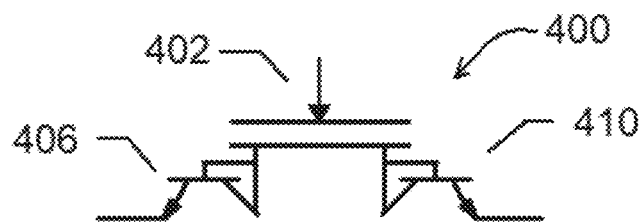
FIG. 4a is a schematic symbol of the TFT of FIG. 2c.

FIG. 4a is a schematic model of TFT 400. In the embodiment of TFT 400, source-channel interfacial member 450 is formed on each of source contact 407 and drain contact 411, but does not extend between the two. This effectively forms a device similar to a JFET with structures similar to BJTs at source contact 407 and drain contact 411, analogous to FIG. 3a.

Figure 4B:
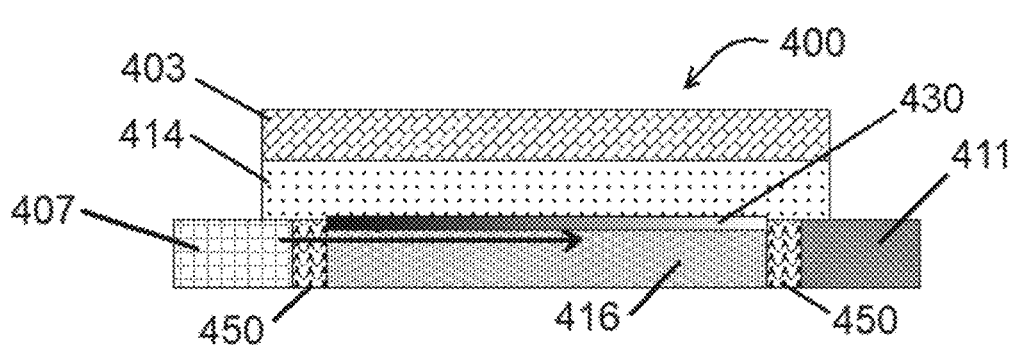
FIG. 4b is a cross-sectional view of a portion of the TFT of FIG. 2c operating in a Forward Active state.

FIG. 4b illustrates TFT 400 in the Forward Active state (wherein $V_{DS} > 0$ $V_{GS} > V_{Threshold}$). Similar to TFT 300 in the Forward Active state, an accumulation layer 430 of electrons forms underneath gate contact 403, below dielectric layer 414. In this state of operation, accumulation layer 430 allows for electron flow from source contact 406 to drain contact 410.

Figure 4C:
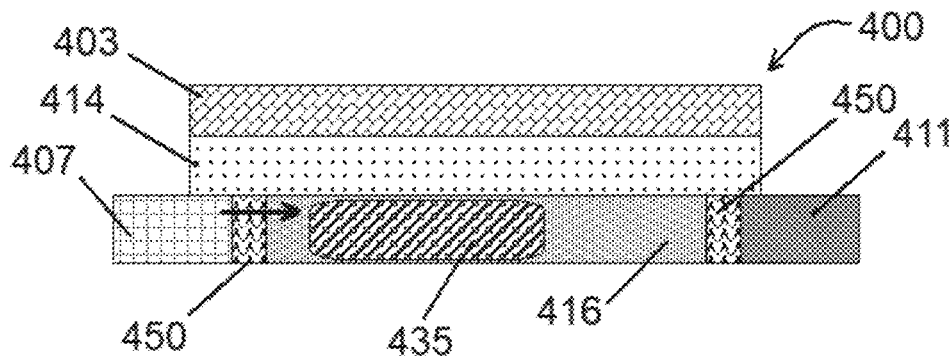
FIG. 4c is a cross-sectional view of a portion of the TFT of FIG. 2c operating in an OFF state.

FIG. 4c illustrates TFT 400 in the 'OFF' state (wherein $V_{DS} > 0$ $V_{GS} < V_{Threshold}$) wherein a depletion region 435 inhibits electron flow between source contact 407 and drain contact 411.

Figure 4D:
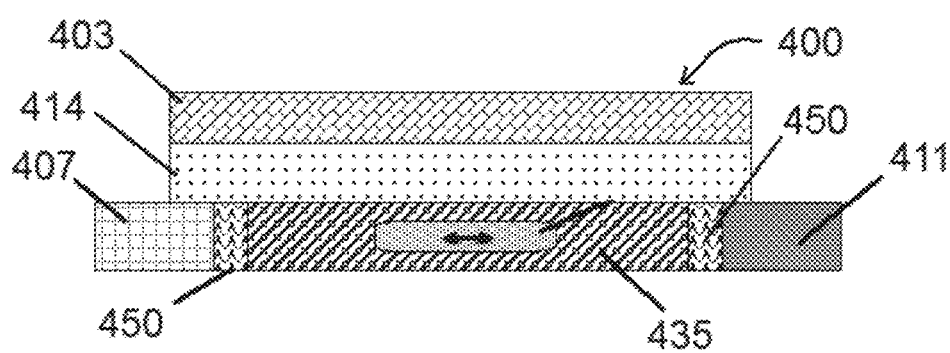
FIG. 4d is a cross-sectional view of a portion of the TFT of FIG. 2c operating in a Zero Voltage state.

FIG. 4d illustrates TFT 400 in a 0V state. Similar to TFT 300, when the gate voltage ($V_{GS}$) of TFT 400 is at or about 0V, depletion region 435 is more prominent and close to both source contact 407 and drain contact 411, thereby greatly reducing, or substantially eliminating, the flow of electrons between source contact 407 and drain contact 411. This places TFT 400 into an enhanced OFF-state, reducing or substantially eliminating parasitic channels in TFT 400.

The differences in the gradients and configurations (e.g. thickness) of the accumulation layer and depletion region between TFT 300 and TFT 400 result from the differences in the extent of the presence of the source-channel interfacial member in the devices. With a higher concentration and distributed presence of the source-channel interfacial member, better depletion layer control of the n-type semiconductor channel is attained.

Reference is next made to FIGS. 5a through 5e, which represent a TFT 500 in accordance with an embodiment of the present invention and its performance in various states of operation. TFT 500 is analogous to TFT 200d of FIG. 2d, and source electrode 507, source contact 506, drain electrode 511, drain contact 510, gate electrode 503, gate contact 502, dielectric layer 514, source-channel interfacial member 550 and n-type semiconductor layer 516 are analogous to the source electrode 208, source contact 207, drain electrode 212, drain contact 211, gate electrode 204, gate contact 203, dielectric layer 214, source-channel interfacial member 250 and semiconductor layer 216 of FIG. 2d.

Figure 5A:
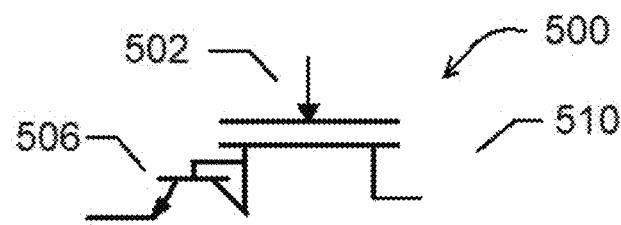
FIG. 5a is a schematic symbol of the TFT of FIG. 2d.

FIG. 5a is a schematic model of TFT 500. In TFT 500, source-channel interfacial member 550 is adjacent to source contact 506 only and this effectively forms a JFET with a BJT at the source contact 506.

Figure 5B:
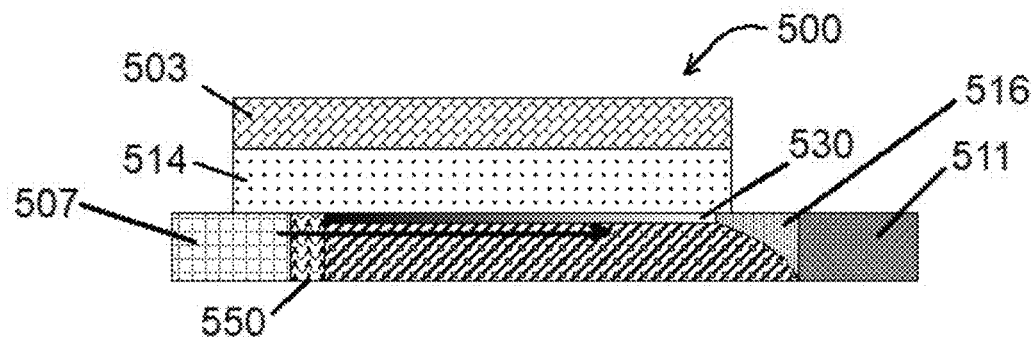
FIG. 5b is a cross-sectional view of a portion of the TFT of FIG. 2d operating in a Forward Active state.
Figure 5C:
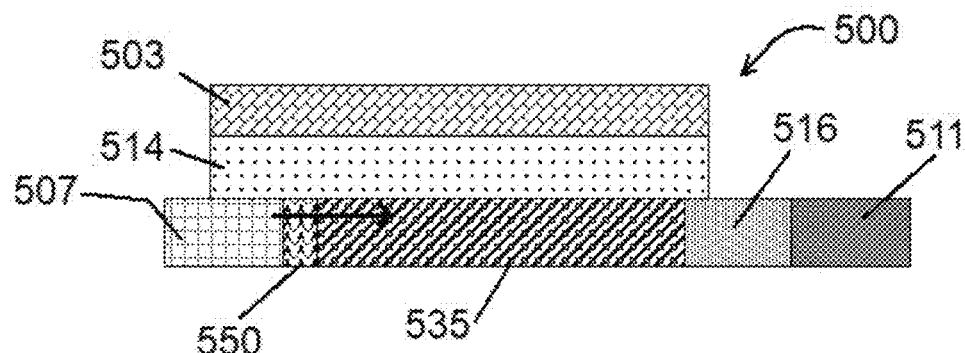
FIG. 5c is a cross-sectional view of a portion of the TFT of FIG. 2d operating in an OFF state.
Figure 5D:
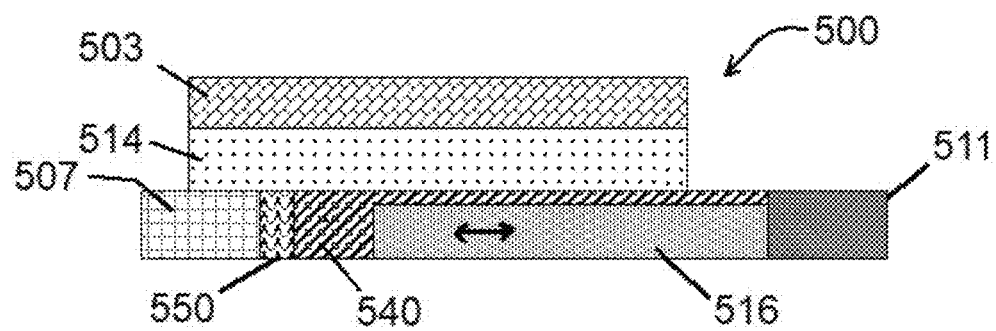
FIG. 5d is a cross-sectional view of a portion of the TFT of FIG. 2d operating in a Zero Voltage state.

FIG. 5b illustrates TFT 500 in the Forward Active state, FIG. 5c illustrates TFT 500 in the 'OFF' state and FIG. 5d illustrates TFT 500 in the 0V state.

Accumulation layer 530 and depletion region 535, 540 characteristics of TFT 500 are analogous to TFT 300 of FIG. 3a and TFT 400 of FIG. 4a, with depletion region 540 being an asymmetric version of the depletion region 435 of FIG. 4d in the 0V stage.

Figure 6:
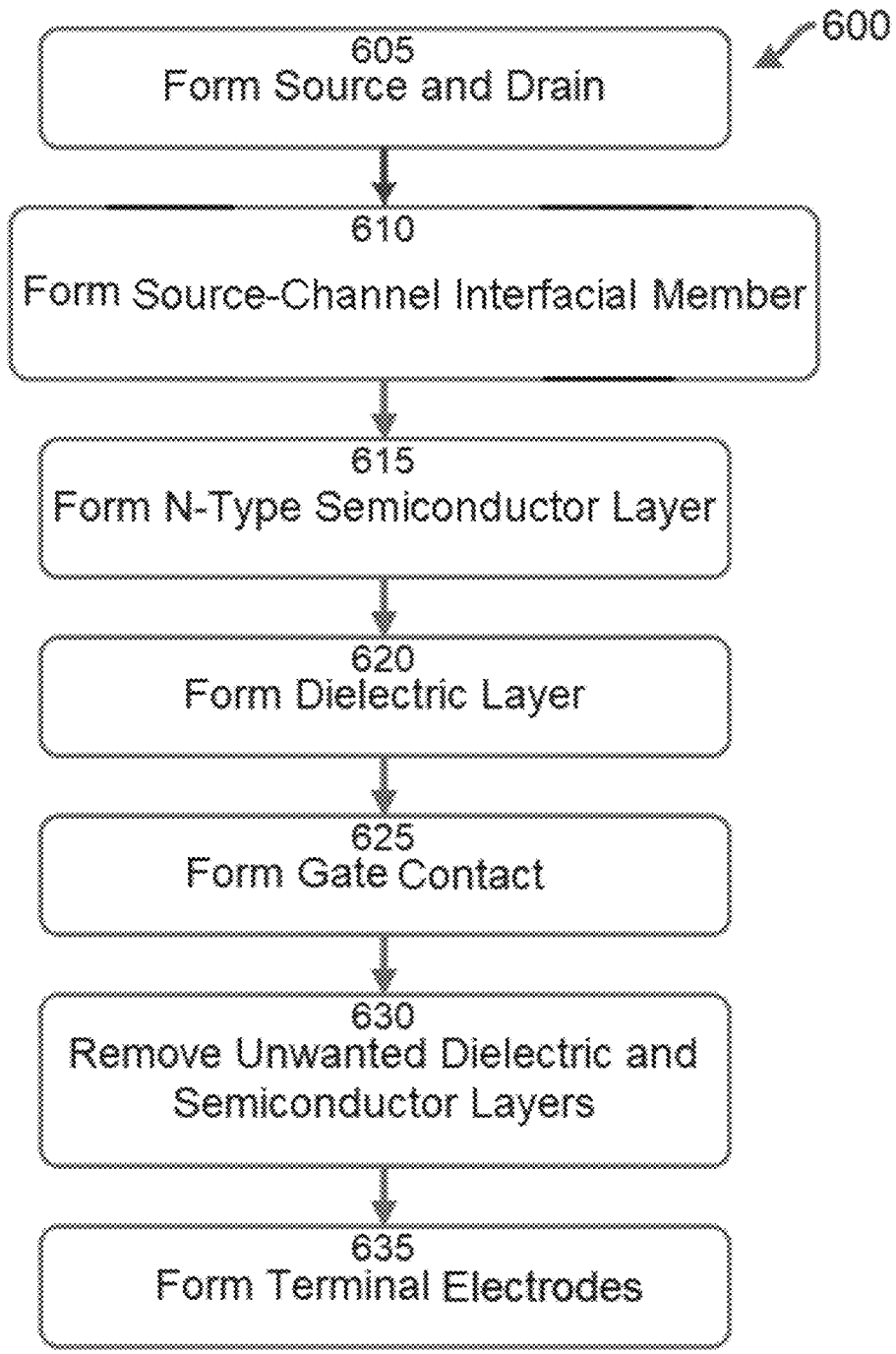
FIG. 6 is flowchart representing the method of fabricating a TFT in accordance with an embodiment of the present invention.

Reference is next made to FIG. 6, which is a flow chart illustrating a method 600 of manufacturing a TFT according to an embodiment of the present invention. Method 600 of FIG. 6 is discussed with reference to FIGS. 7a through 7n for a TFT 700 and to FIGS. 8a through 8d, for TFT 800a and TFT 800b, which illustrate examples of the various steps involved in the method.

As used herein, the terms "form" or "forming" are intended to encompass any suitable manner for manufacturing the structures recited in this disclosure. As such, "form" and "forming" can include processes such as: atomic layer deposition; chemical vapor deposition; plasma enhanced chemical vapor deposition, sputtering; ion implantation; oxidation; electrochemical deposition; molecular beam epitaxy; etc. The selection of specific appropriate processes is well within the purview of those of skill in the art.

Figure 7A:
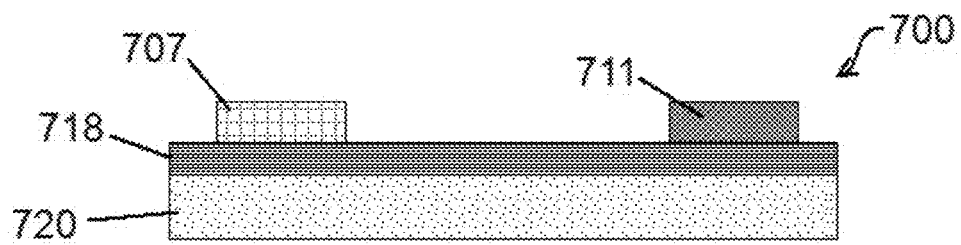
FIGS. 7a to 7g are cross-sectional views of the stages of fabrication of a TFT in accordance with the method of FIG. 6.

Method 600 begins at step 605 where source contact 707 and drain contact 711 contact are formed on top of an insulation layer 718, which is, in turn formed on top of a substrate 720, as shown in FIG. 7a. FIG. 7a illustrates a cross-sectional view of TFT 700, taken through line B-B of FIG. 7h which shows a corresponding top view.

As previously mentioned, insulation layer 718 can be formed from materials such as: silicon dioxide ($SiO_2$); silicon nitride ($Si_3N_4$); aluminum oxide ($Al_2O_3$); etc. Substrate 720 can be any suitable substrate suitable for serving as the foundation for the construction of components and devices, such as transistors and integrated circuits, image sensors and displays and examples of which include, without limitation, silicon, flexible polymers and other plastics, ceramic materials, optical glass, metals, etc.

In some cases, source contact 707 and drain contact 711 are formed by deposition via lithography process. However, as will be apparent to those of skill in the art, the methods of forming source contact 707 and drain contact 711 are not particularly limited and they can be formed through a variety of other processes as will be apparent to those of skill in the art.

In cases where source contact 707 and drain contact 711 are formed from the same material, then at step 605, both source contact 707 and drain contact 711 can be formed simultaneously in the same step. In cases where source contact 707 and drain contact 711 consist of different materials, then source contact 707 and drain contact 711 can be formed in separate steps.

At step 610, source-channel interfacial member 750 is formed. In the example illustrated in FIG. 7*b*, which is a cross section taken through line C-C of FIG. 7*i*, source-channel interfacial member 750 is formed on top of source contact 707 and drain contact 711 and extends over the area of insulation layer 718 between them. Source-channel interfacial member 750 can be a p-type semiconductor formed by any suitable technique including, without limitation, deposition techniques, such as atomic layer deposition, sputtering or chemical vapor deposition.

Figure 7B:
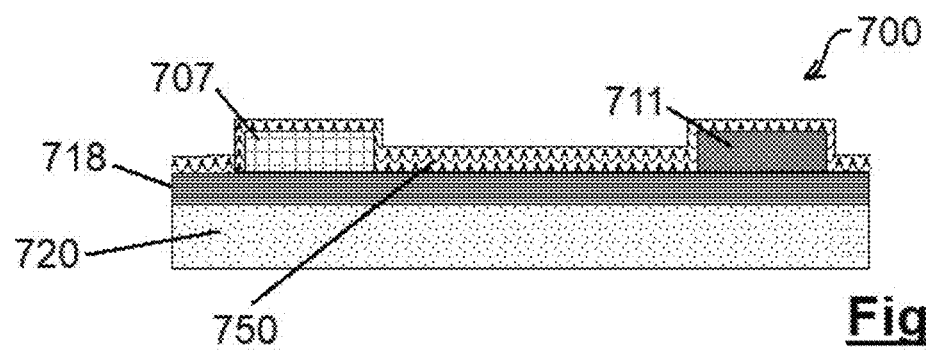
Figure 8A:
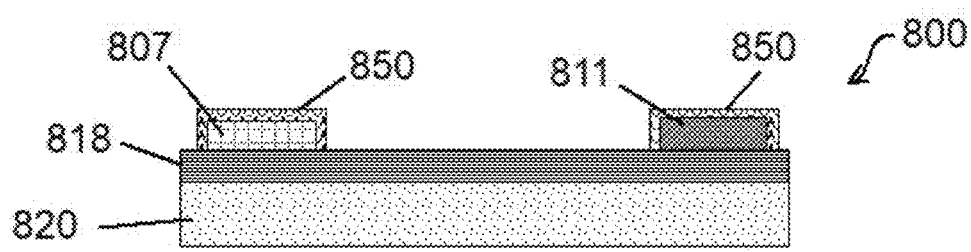
FIG. 8a is a cross-sectional view of a TFT during fabrication, according to an embodiment of the present invention.
Figure 8B:
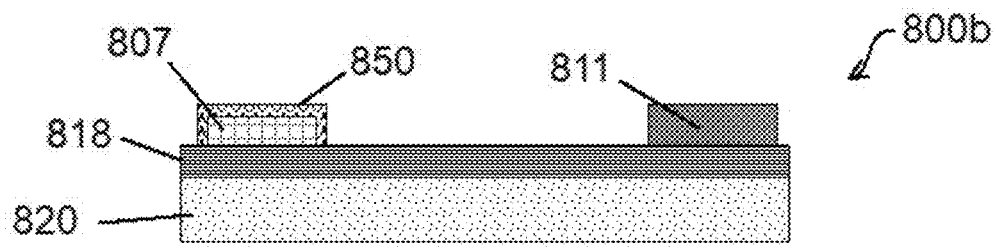
FIG. 8b is a cross-sectional view of a TFT during fabrication, according to another embodiment of the present invention.
Figure 8C:
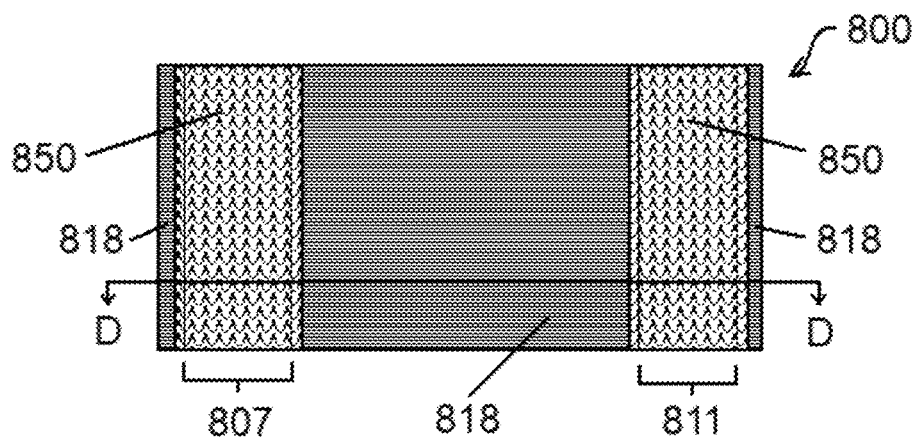

However, source-channel interfacial member 750 can also be formed in other ways and reference is made to FIG. 8*a* which illustrates a cross-sectional view, taken through line D-D of FIG. 8*c*, of a TFT 800, similar to that of FIG. 7*b*, according to another embodiment of the present invention. In TFT 800, source-channel interfacial member 850 has been formed by a controlled oxidation of the underlying metal structure of both source contact 807 and drain contact 811. As shown, this results in source-channel interfacial member 850 forming on source contact 807 and source-channel interfacial member 850 forming on drain contact 811.

Figure 8D:
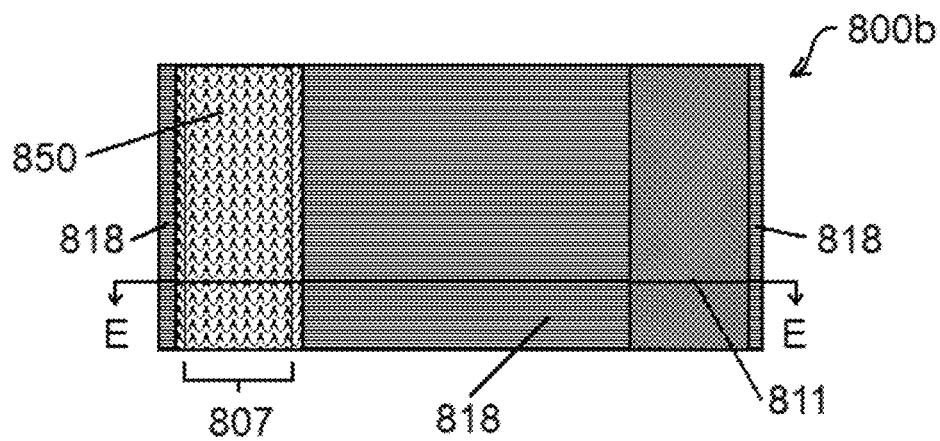
FIG. 8d is a top view of the TFT of FIG. 8b.

FIG. 8*b* shows a cross-sectional view, taken along line E-E of FIG. 8*d*, of a TFT 800*b* according to another embodiment of the present invention. In TFT 800*b*, drain contact 811 is formed of a noble material (i.e.—one which will not oxidize) and source-channel interfacial member 850 is formed by the controlled oxidation of the underlying metal structure of just source contact 807. As shown, this results in source-channel interfacial member 850 on source contact 807 only.

Figure 7C:
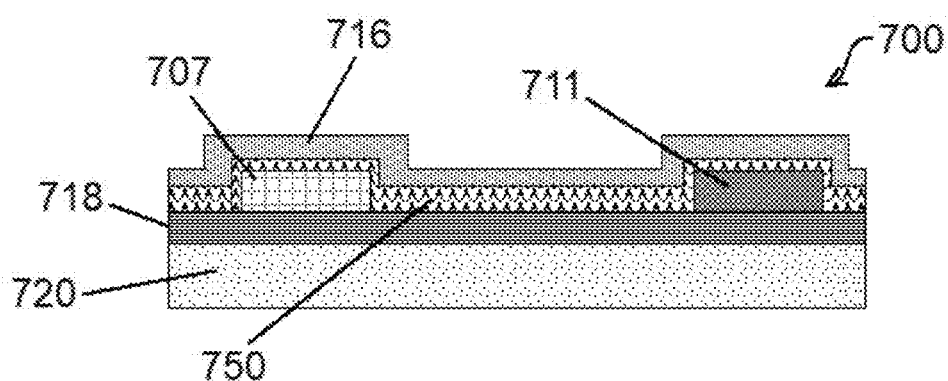
Figure 7D:
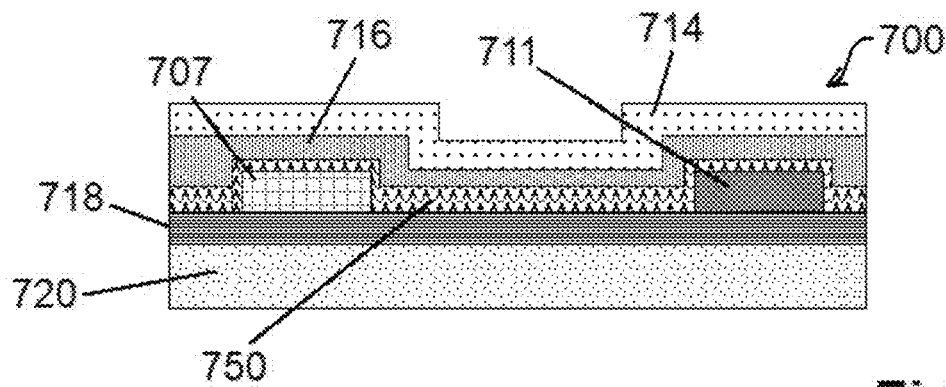

Returning again to FIGS. 7*a* through 7*n* and method 600, at step 615 n-type semiconductor layer 716 is formed. FIG. 7*c* shows a cross section, taken along line F-F of FIG. 7*j*, after semiconductor layer 716 is formed across TFT 700, including on top of source-channel interfacial member 750.

At step 620, a dielectric layer 714 is formed. As shown in the cross section of FIG. 7*d*, taken through line G-G of FIG. 7*k*, dielectric layer 714 is formed over the entire device, including on top of semiconductor layer 716. Dielectric layer 714 is preferably formed of a material with a high dielectric constant, although other materials, such as $SiO_2$ or $Si_3N_4$, can also be employed.

Figure 7E:
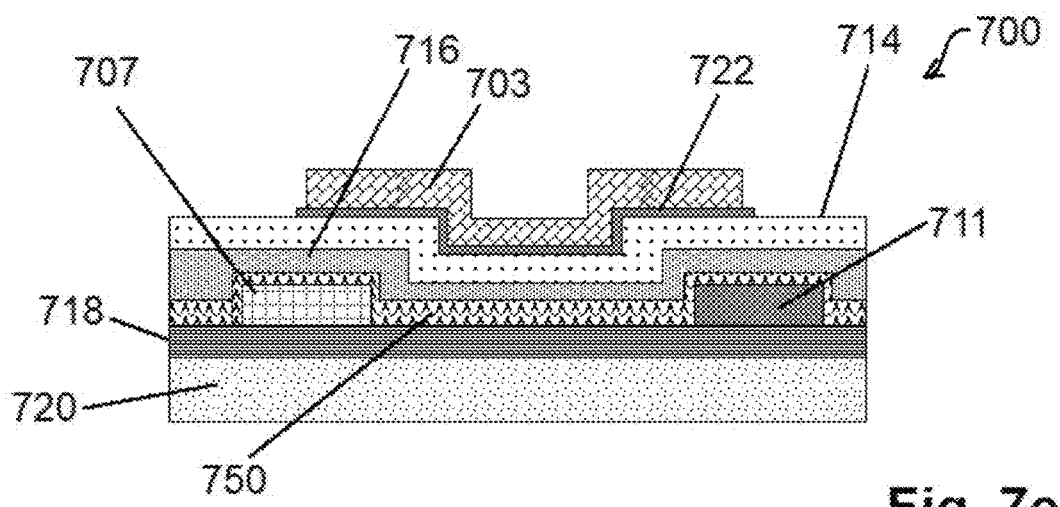

At step 625, gate contact 703 is formed. As shown in FIG. 7*e*, which is a cross section taken through line H-H of FIG. 7*l*, gate contact 703 is formed on dielectric layer 714. In some cases, an optional gate tuning layer 722 can also be formed between dielectric layer 714 and gate contact 703. In such cases, gate tuning layer 722 is formed first and gate contact 703 is formed on top of gate tuning layer 722 as shown in FIG. 7*e*.

Figure 7F:
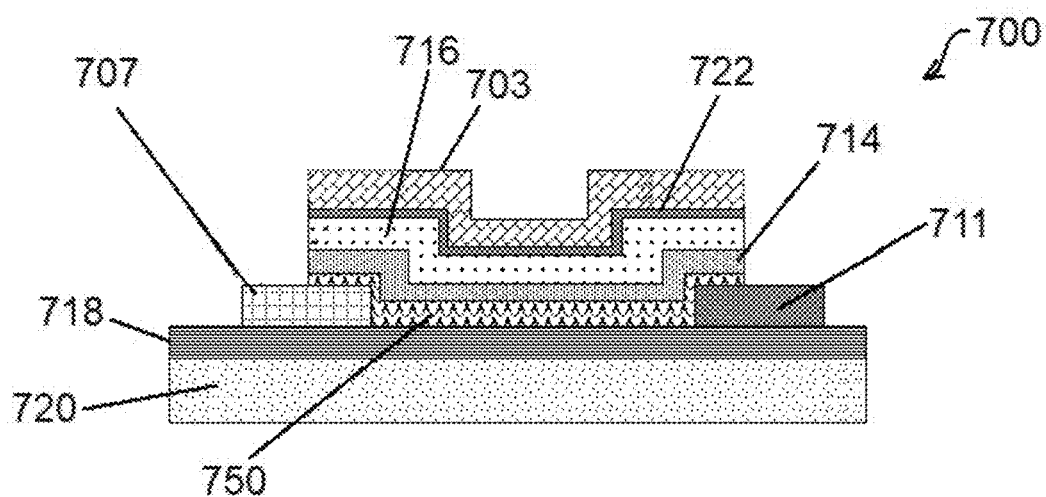

At step 630, the unwanted portions of dielectric layer 714 and underlying semiconductor layer 716 and source-channel interfacial member 750 are removed. FIG. 7*f*, a cross section of TFT 700 taken along line I-I of FIG. 7*m*, shows that gate contact 703 can be used as a mask to remove portions of dielectric layer 714 and underlying semiconductor layer 716 and source-channel interfacial layer 750.

Figure 7G:
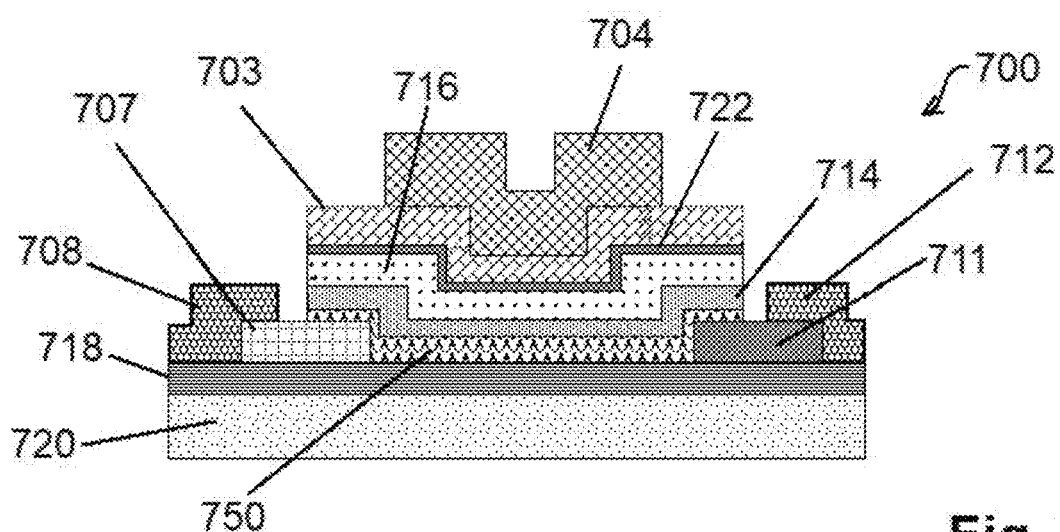
Figure 7N:
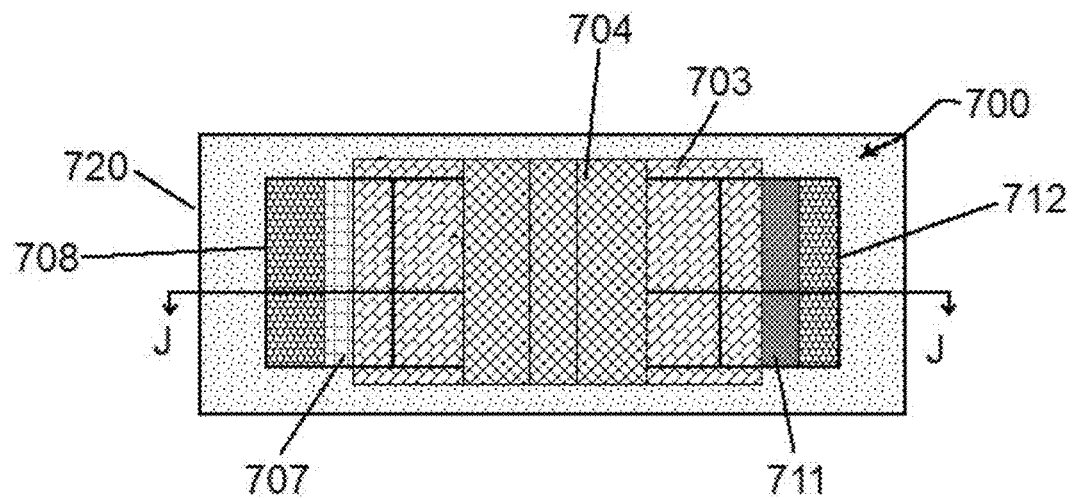
FIGS. 7h to 7n are respective top views of the fabrication stages of the TFT of FIGS. 7a to 7g.
Figure 7H:
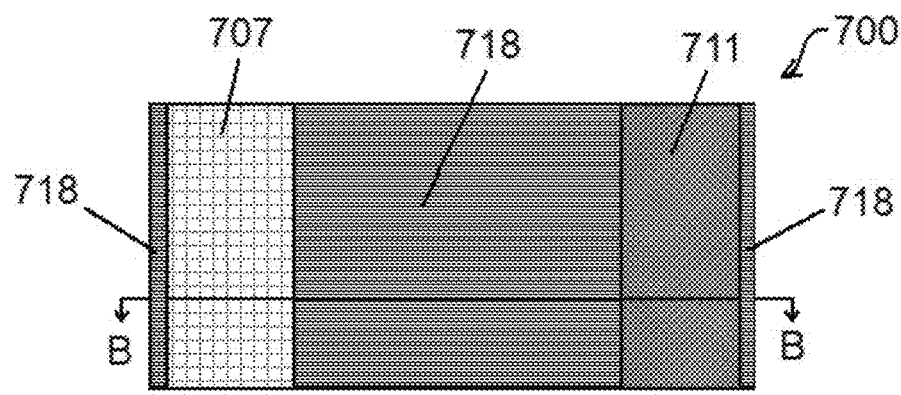
Figure 7I:
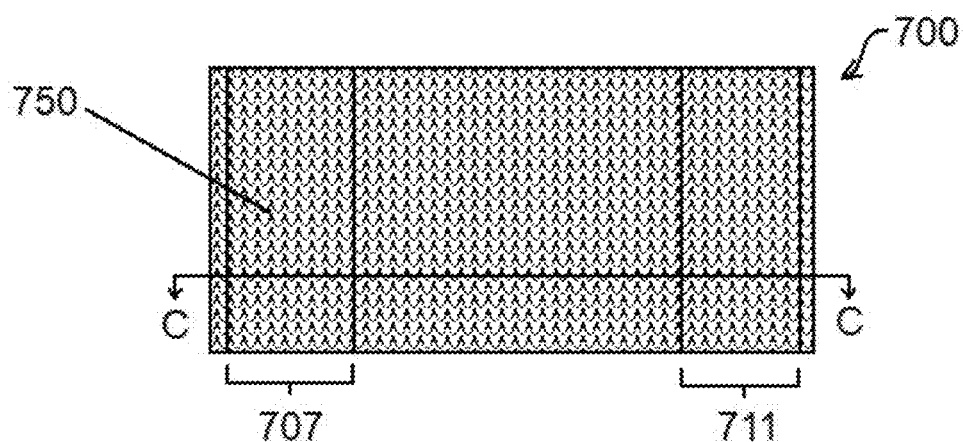
Figure 7J:
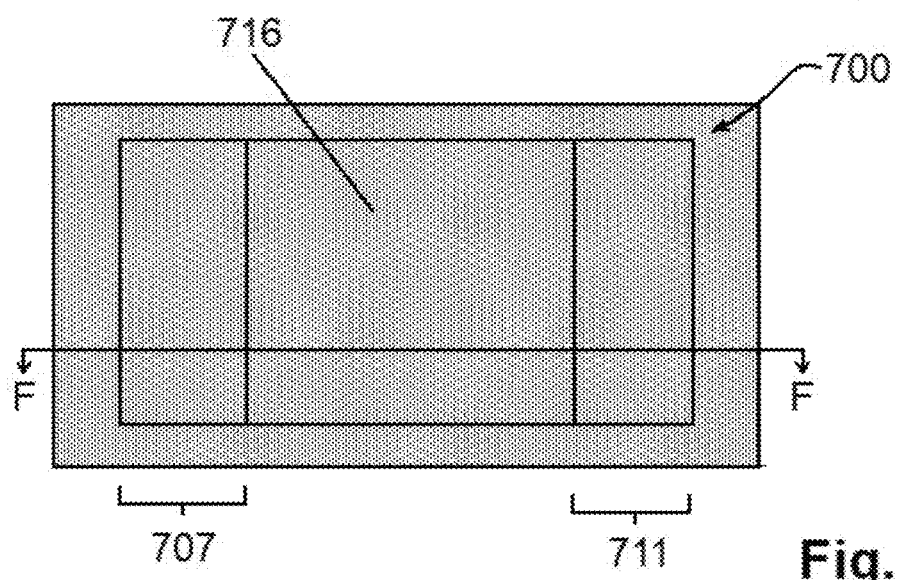
Figure 7K:
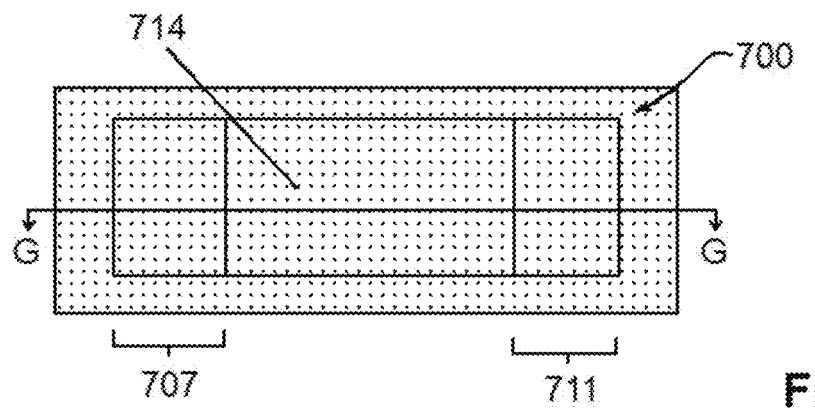
Figure 7L:
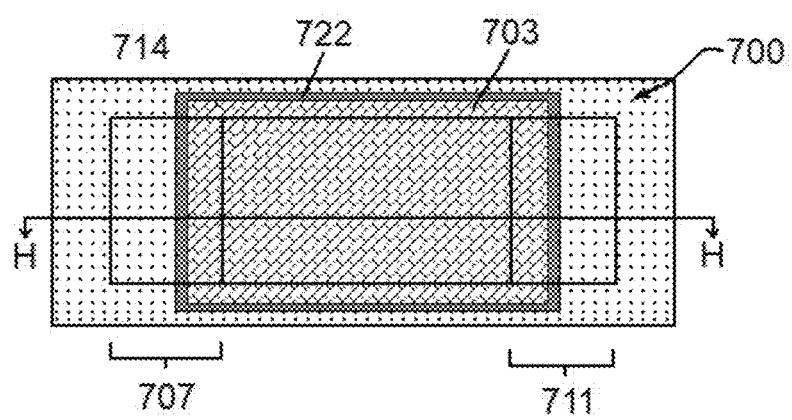
Figure 7M:
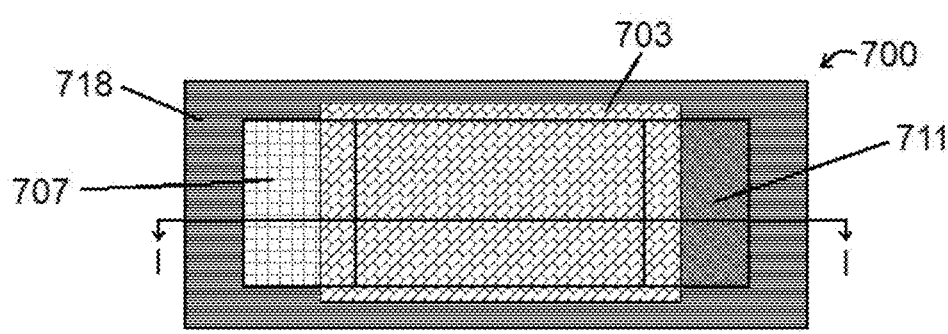

At step 635, gate electrode 704, source electrode 708 and drain electrode 712 are formed as shown in FIG. 7*g*, which is a cross section taken along line J-J of FIG. 7*n*.

Figure 9A:
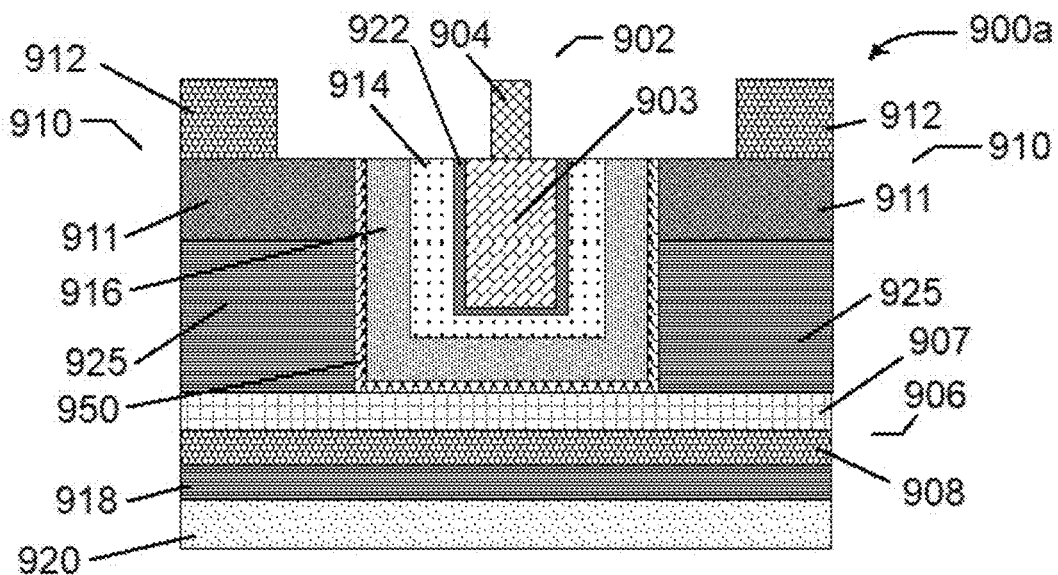
FIG. 9a is a cross-sectional view of a vertical TFT according to another embodiment of the present invention.
Figure 9B:
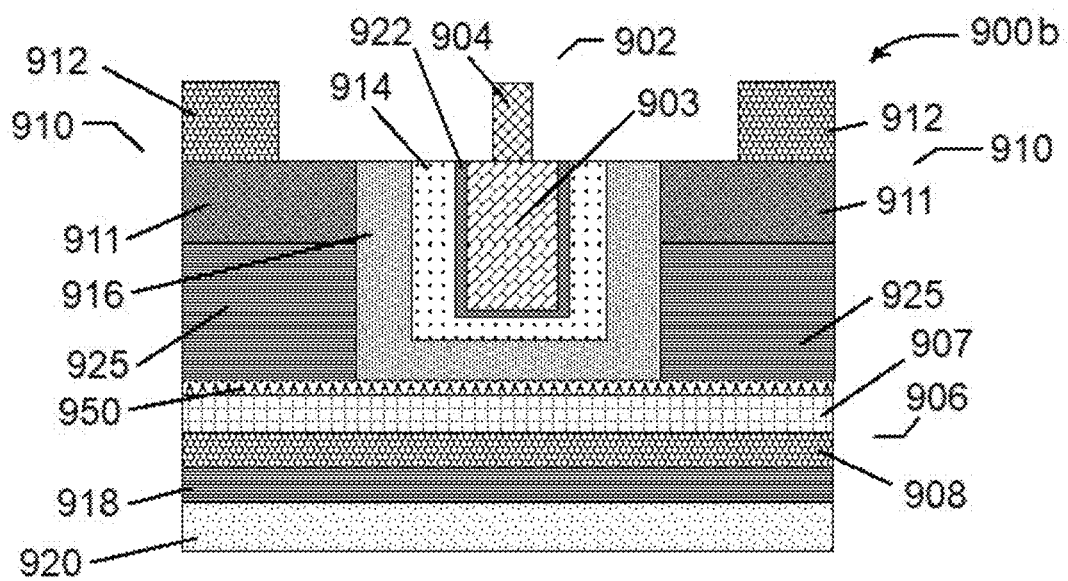
FIG. 9b is a cross-sectional view of another vertical TFT according to an embodiment of the present invention.
Figure 9C:
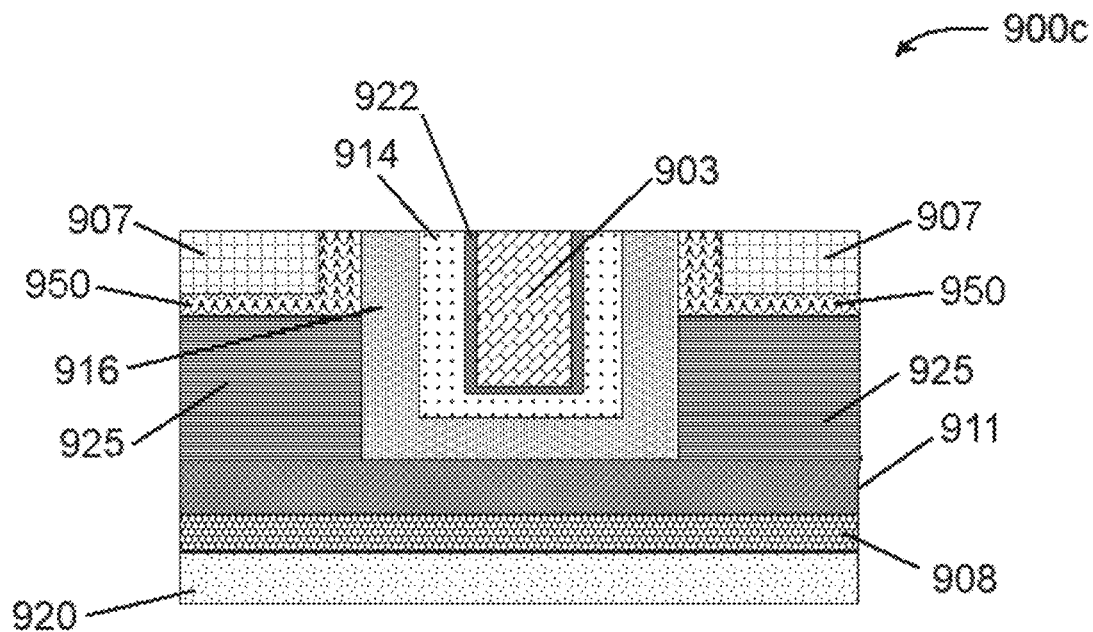
FIG. 9c is a cross-sectional view of another vertical TFT according to an embodiment of the present invention.

In some circumstances, it may be desired to fabricate TFTs in accordance with embodiments of the present invention in a vertical configuration. Accordingly, FIGS. 9*a*, 9*b* and 9*c* illustrate embodiments of such vertically formed TFTs. As will be understood by those of skill in the art, vertically formed TFTs can allow for increased "packaging density" (i.e.—more devices in a given horizontal area) which can be important for some applications such as display screens or image sensors. Further, because TFTs in accordance with the present invention can be fabricated on a variety of substrates, TFTs in accordance with the present invention can be "stacked", one atop another, to increase device density which can be very desirable for many different applications. For example, a layer of vertical TFTs and any related interconnections or other components, in accordance with the present invention, can be formed and then a layer of insulating material, such as silicon dioxide, can be formed over them and that insulating layer can serve as the substrate and insulating layer for another set of TFTs which are formed on it. It is contemplated that several layers of TFTs can be formed in this manner significantly increasing circuit densities compared to the prior art.

FIG. 9*a* shows a TFT 900*a* that includes a gate 902, a source 906 and a drain 910. Gate 902 includes a gate contact 903 and a gate electrode 904, source 906 includes a source contact 907 and a source electrode 908, and drain 910 includes a drain contact 911 and a drain electrode 912. TFT 900*a* also includes a dielectric layer 914 around gate 902 of TFT 900*a* and includes a first insulation layer 918 formed over a substrate 920, and a second insulation layer 925. TFT 900*a* further includes an n-type semiconductor layer 916 and a source-channel interfacial member 950. If desired, TFT 900*a* can also include a gate tuning layer 922 as illustrated.

In TFT 900*a*, source 906, including source contact 907 and source electrode 908, are at the bottom (with respect to the orientation of the Figure) of TFT 900*a*, having been formed on top of first insulation layer 918. Second insulation layer 925 is formed over a portion of source contact 907 leaving a portion of source contact 907 exposed in the middle of TFT 900*a*. Drain contact 911, with drain electrode 912 formed on drain contact 911, is formed on either side of the exposed portion of source contact 907. Source contact 907 is insulated from drain contact 911 by second insulation layer 925.

In TFT 900*a*, source-channel interfacial member 950 is formed on the above-mentioned exposed portion of source contact 907, the inner surface of second insulation layer 925 and on drain contact 911. Gate contact 903 is surrounded by (optional) gate tuning layer 922, which is in turn surrounded by dielectric layer 914. Semiconductor layer 916 is formed between the dielectric layer 914 and source-channel interfacial member 950.

FIG. 9*b* illustrates a TFT 900*b* which is another embodiment of the present invention that is analogous to TFT 900*a*, but wherein the extent and location of source-channel interfacial member 950 is altered.

Specifically, in TFT 900*b* source-channel interfacial member 950 is formed as a layer over the entire upper surface of source contact 907. As shown in FIG. 9*b*, and unlike in the embodiment of FIG. 9*a*, source-channel interfacial member 950 is absent from the inner surface of second insulation layer 925 and drain contact 911 in TFT 900*b*. Instead, semiconductor layer 916 is formed between dielectric layer 914, the inner surface of second insulation layer 925 and drain contact 911.

FIG. 9*c*, shows a cross-sectional view of a TFT 900*c* according to another embodiment of the present invention.

Similar to TFTs 990a and 900b of FIGS. 9a and 9c, TFT 900c is a vertical implementation of a TFT in accordance with an embodiment of the present invention.

However, TFT 900c differs from the above-described TFTs 900a and 900b in that the bottom contact of TFT 900c is drain contact 911. Conversely, the top contact of TFT 900c is source contact 907. As shown in FIG. 9c, source-channel interfacial member 950 is formed around source contact 907. Source-channel interfacial member 950 is isolated from drain contact 911 due to the presence of second insulation layer 925 and is separated from dielectric layer 914 by semiconductor layer 916.

Figure 9D:
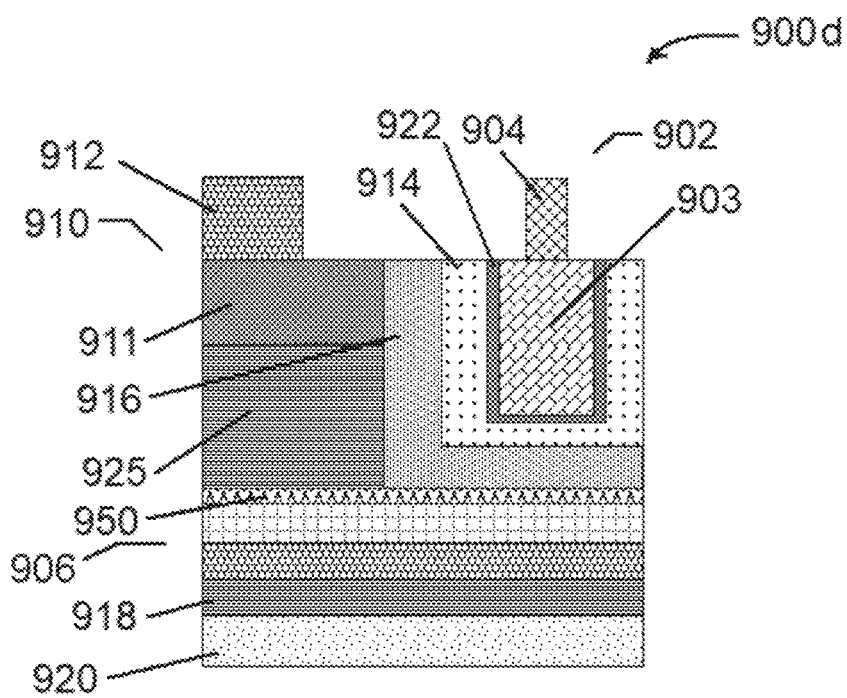
FIG. 9d is a cross-sectional view of a vertical TFT similar to that of FIG. 9b but fabricated in a non-symmetric embodiment.

While the embodiments of FIGS. 9a, 9b and 9c show "symmetric" implementations of vertical TFTs in accordance with aspects of the present invention, it will be readily apparent to those of skill in the art that such symmetry is not required. For example, FIG. 9d shows a non-symmetric implementation of a TFT 900d wherein the right hand side (with respect to the orientation of the Figure) of TFT 900b has been omitted. A wide variety of other, non-symmetric and/or reduced area implementations of vertical TFTs in accordance with aspects of the present invention will now be apparent to those of skill in the art.

As will now be apparent to those of skill in the art, TFT 900a, TFT 900b, TFT 900c and TFT 900d function in manners similar to the other embodiments of the present invention disclosed herein. As mentioned above, TFTs 900a, 900b, 900c and 900d can be formed as vertical cylinders, rectangular parallelepipeds, hexagonal prisms, etc. and this variety of possible shapes allows the "footprint" of TFTs 900a, 900b, 900c and 900d to be selected to optimize the density at which TFTs 900a, 900b, 900c and 900d can be formed in a device. This provides several advantages, especially in applications such as DRAM memory wherein increasing memory cell density is an important goal.

Further, as also mentioned above, TFTs 900a, 900b, and 900c can be "stacked" to increase circuit element densities. Specifically, an array of TFTs 900a, 900b, or 900c can be formed upon a substrate and/o insulator covering a lower layer of circuit elements (including TFTs 900a, 900b and 900c) and, in turn covered by a substrate and/or insulator and another array of TFTs 900a, 900b, or 900c formed atop that substrate and/or insulator—resulting in true 3D integrated circuits being formed.

Figure 10A:
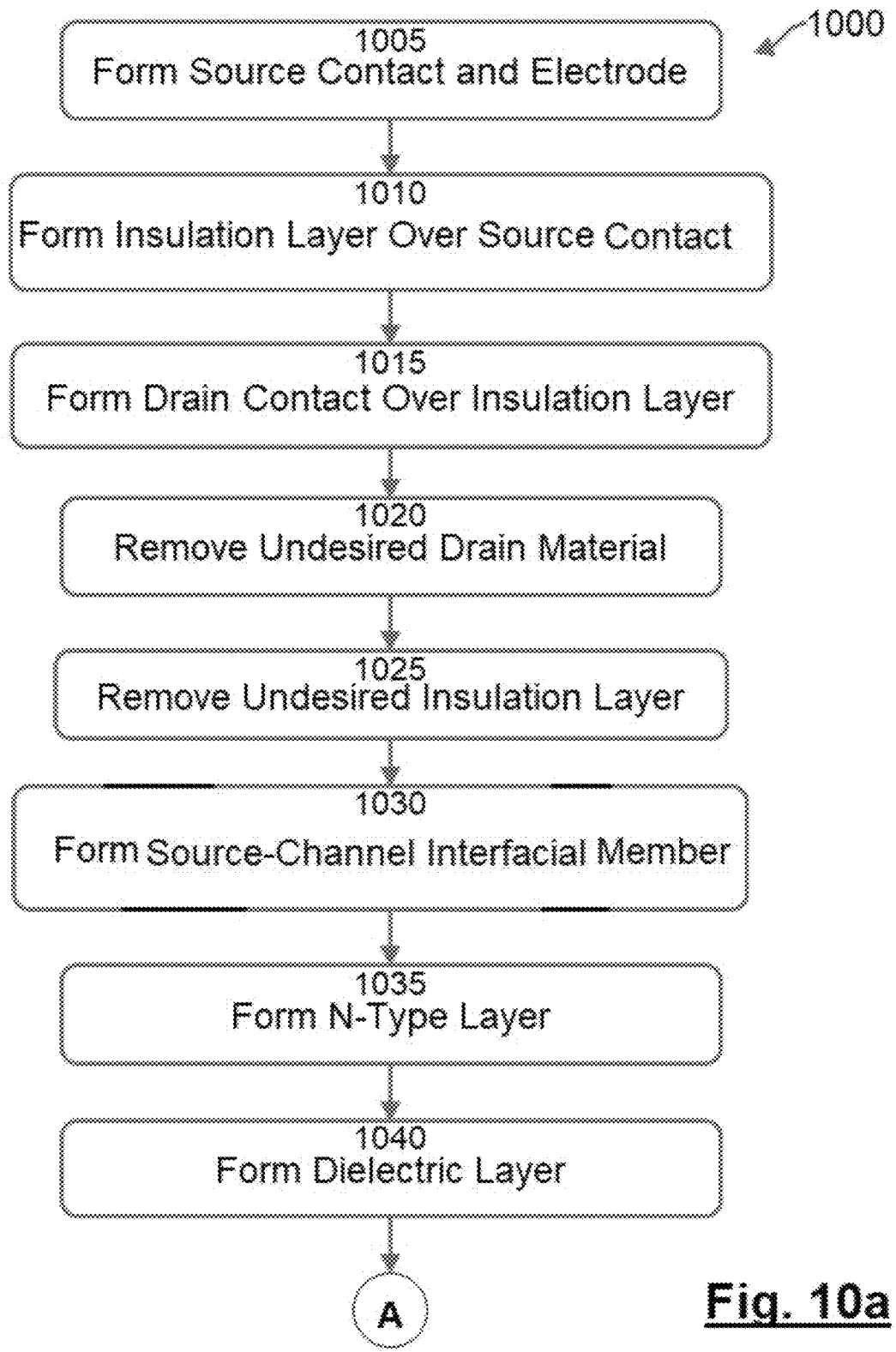
FIGS. 10a and 10b are a flowchart of a method of fabricating a TFT according to another embodiment of the present invention.
Figure 10B:
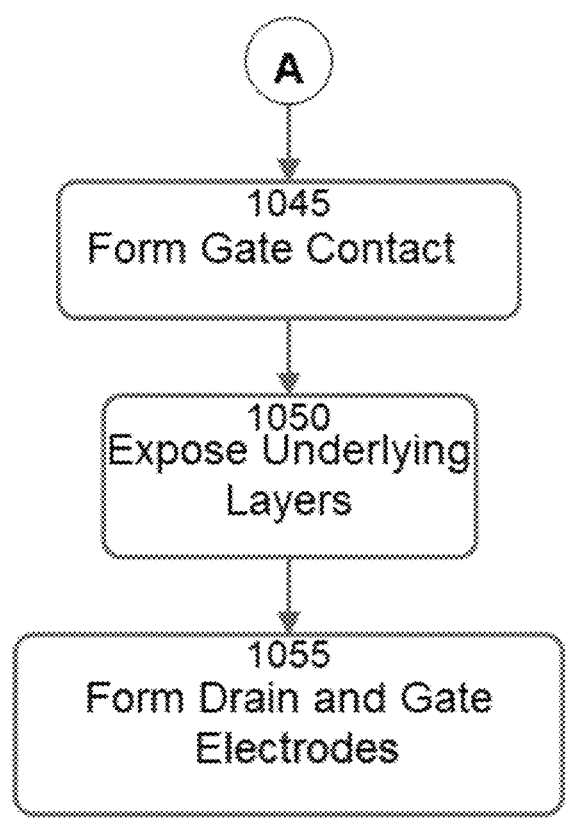

Reference is now made to FIGS. 10a and 10b which are a flowchart of a method 1000 of manufacturing a vertical TFT 1200, similar to TFT 900a discussed above. Method 1000 of FIGS. 10a and 10b is discussed with reference to FIGS. 11a through 11v which illustrate the various steps involved in the method.

Figure 11A:
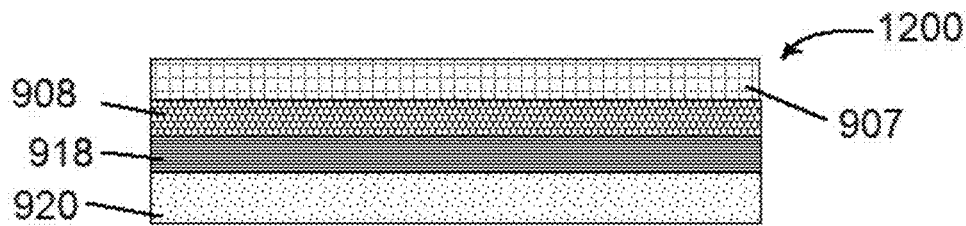
FIGS. 11a through 11k are cross-sectional views showing stages of manufacturing a TFT according to the method of FIGS. 10a and 10b.

Method 1000 begins at step 1005 where source electrode 908 and source contact 907 are formed on first insulation layer 918 which is, in turn, formed on substrate 920, as shown in FIG. 11a. FIG. 11a is a cross section of FIG. 11l, taken along line K-K. Source contact 907 can be formed of copper, tungsten or any other material usable in the fabrication of a vertical transistor as will occur to those of skill in the art. In particular, the material of source contact 907 is selected based on Work function and surface oxidation properties of the material in order to provide the desired effect of the injection of electrons into the accumulation layer during operation of TFT 1200, as will now be apparent to those of skill in the art. It is also contemplated that source electrode 908 and source contact 907 can be one and the same element if desired.

Figure 11B:
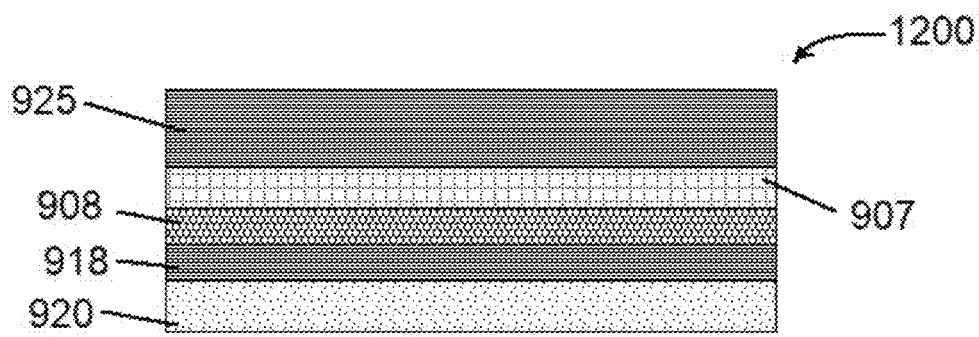
Figure 11C:
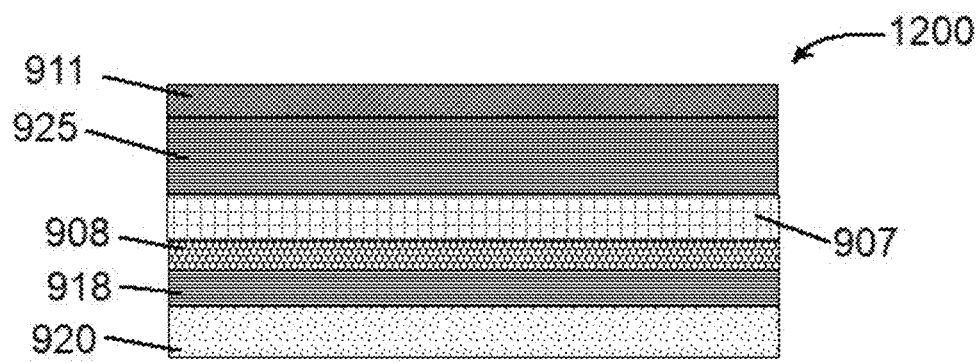
Figure 11D:
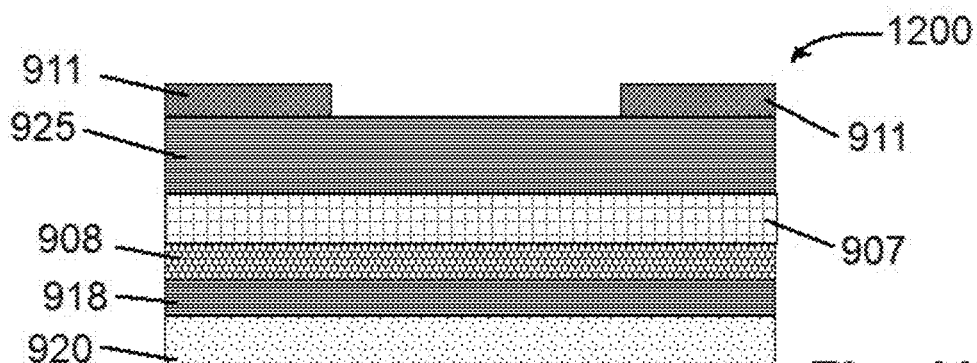
Figure 11E:
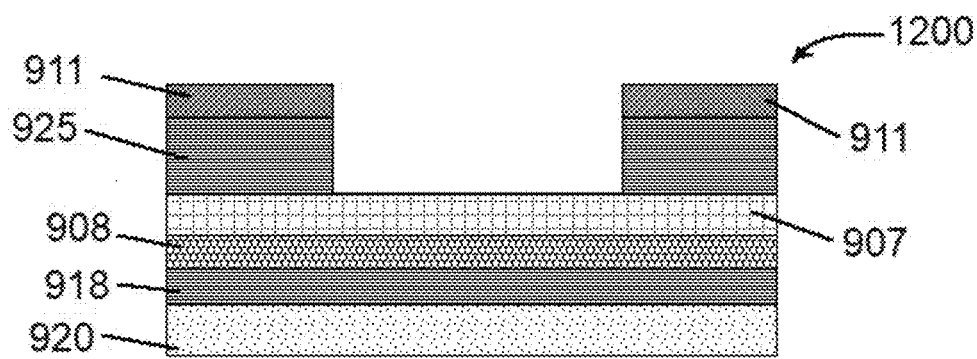
Figure 11F:
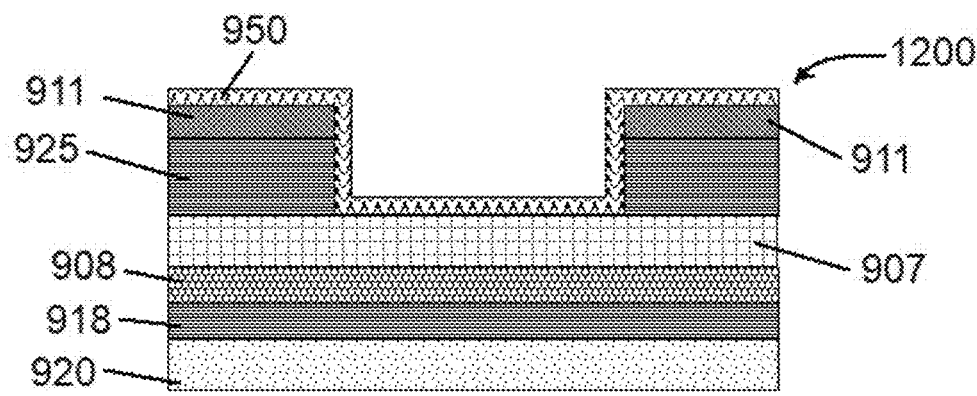
Figure 11G:
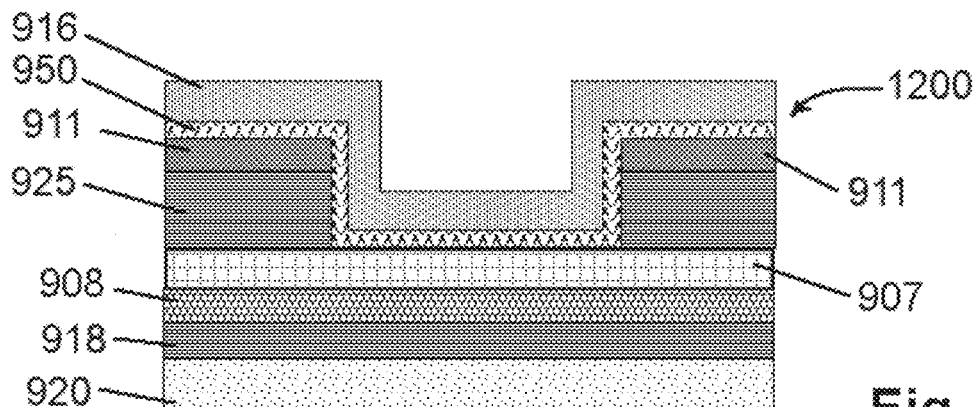
Figure 11H:
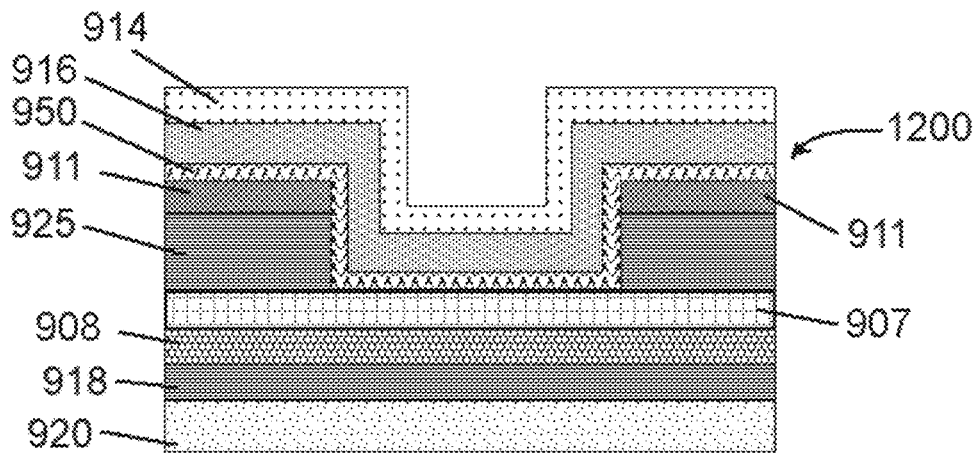
Figure 11I:
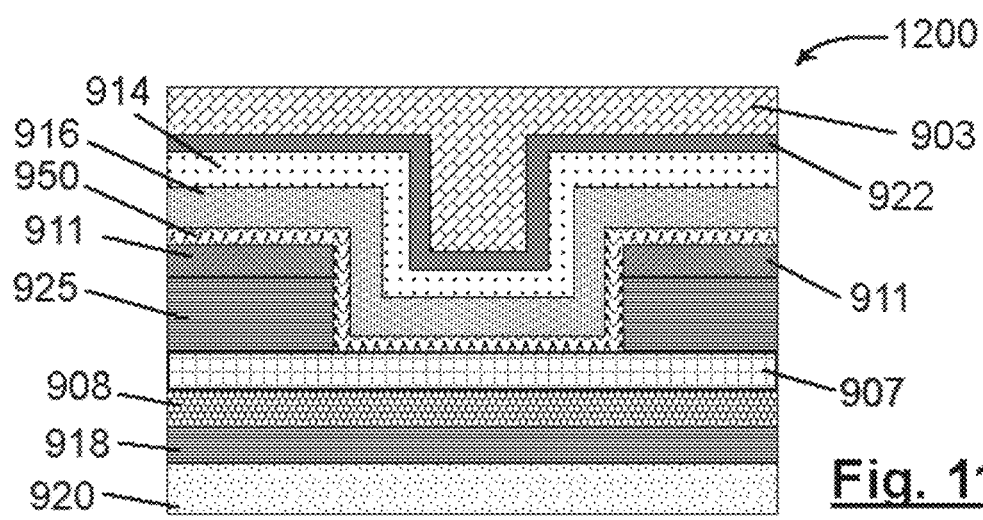
Figure 11J:
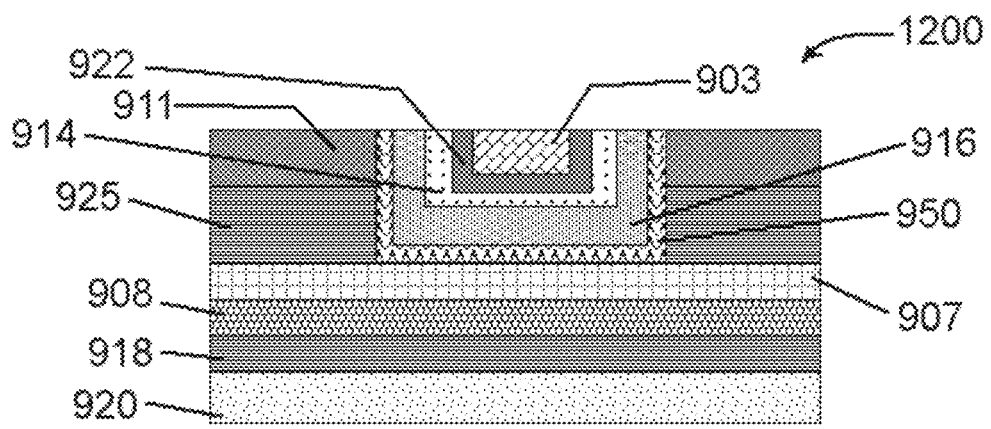
Figure 11K:
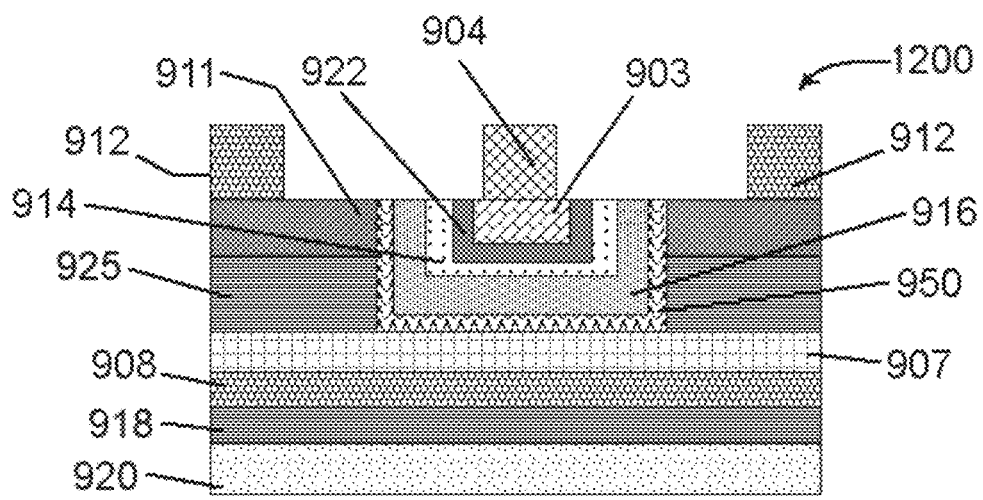
Figure 11L:
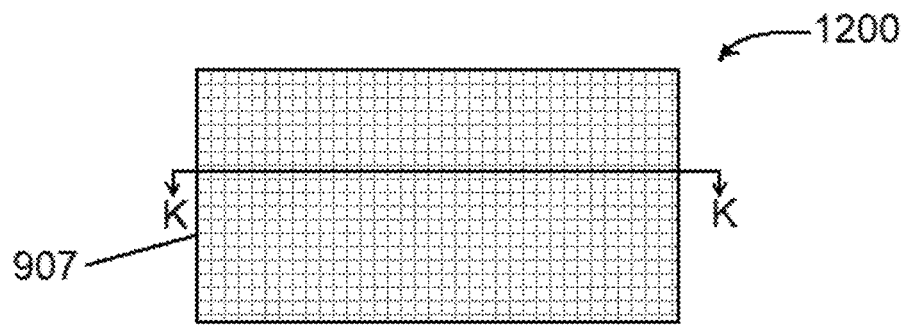
FIGS. 11l through 11v are corresponding top views of the TFT of FIGS. 11a through 11k, respectively.
Figure 11M:
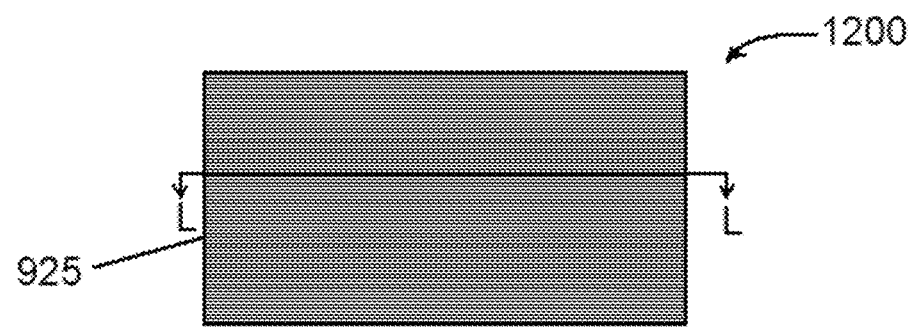

At step 1010, a second insulation layer 925 is formed over source contact 907, as shown in FIG. 11b, which is a cross section taken along line L-L of FIG. 11m. As can be seen, second insulation layer 925 is formed over the entire upper surface of source contact 907. Second insulation layer 925 can be formed using any suitable technique as will occur to those of skill in the art, including spin coating of polymers, chemical vapor deposition of dielectrics, etc.

Figure 11N:
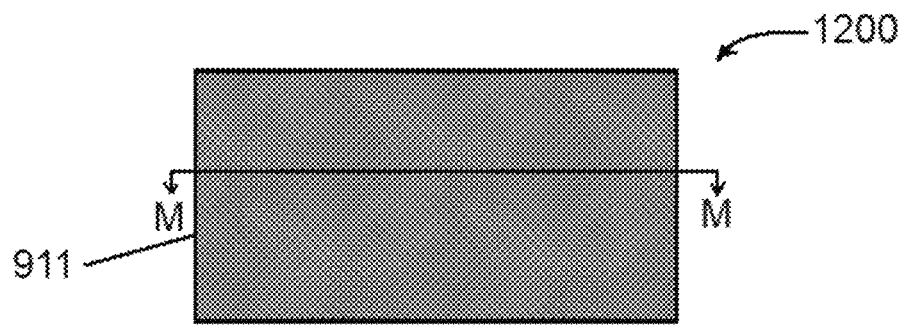

At step 1015, drain contact 911 is formed as shown in FIG. 11c, which is a cross section taken along line M-M of FIG. 11n. As shown, drain contact 911 is formed over the entire upper surface of second insulation layer 925.

Figure 11O:
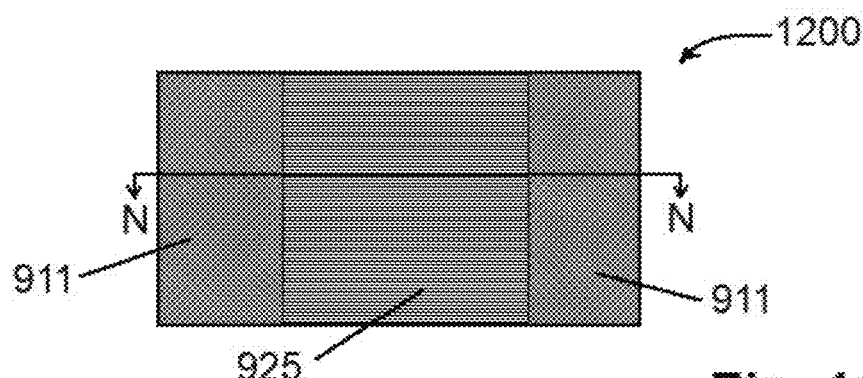

At 1020, the undesired material of drain contact 911 is removed. The undesired material can be removed in any suitable manner as will occur to those of skill in the art, such as by patterning and etching. FIG. 11d, which is a cross section taken along line N-N of FIG. 11o, shows the result of step 1020. It will be apparent to those of skill in the art that, if desired, the undesired material of drain contact 911 can be removed such that drain contact 911 is formed in a geometric shape, such as a hexagon, that can permit an enhanced packaging density of TFTs 1200.

Figure 11P:
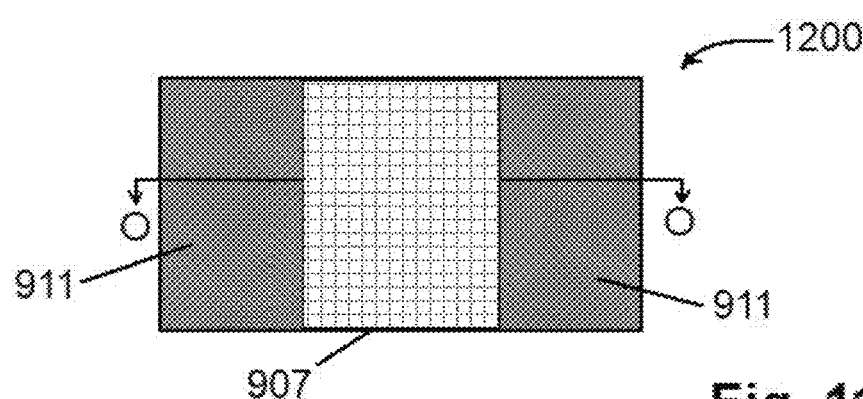

At step 1025, undesired portions of second insulation layer 925 are removed down to source contact 907, as shown in FIG. 11e, which is a cross section taken along line O-O of FIG. 11p. In some embodiments, the undesired portions of second insulation layer 925 are removed via an etching process, which is selected so that it stops on the underlying source contact 907, although any other suitable method of removing the undesired portions of second insulation layer 925 can also be employed, as will occur to those of skill in the art.

Figure 11Q:
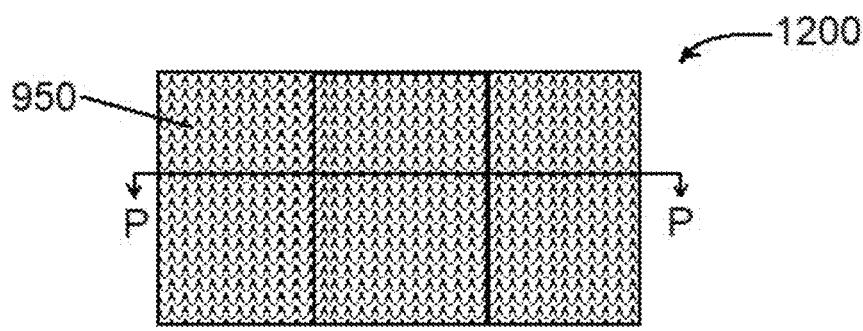

At step 1030, a source-channel interfacial member 950 is formed on the result of step 1025. As shown in FIG. 11f, which is a cross section taken along line P-P of FIG. 11q, source-channel interfacial member 950 is formed over the entire upper surface of TFT 1200 at this point, including over drain contact 911 and over the exposed portion of source contact 907. Source-channel interfacial member 950 can be formed in a variety of manners and, in one embodiment, is deposited using atomic layer deposition techniques.

Figure 11R:
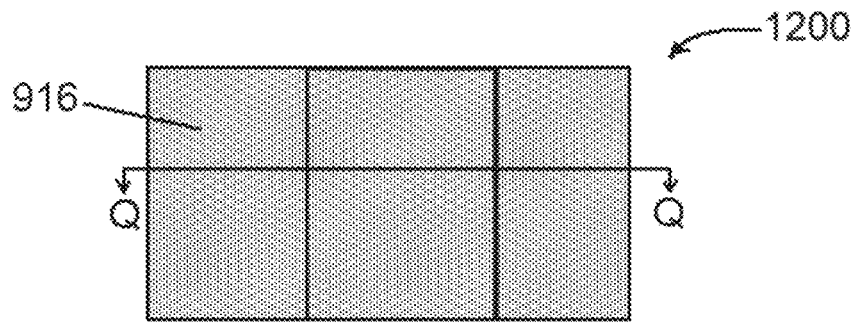

At step 1035, an n-type semiconductor layer 916 is formed over source-channel interfacial member 950, as shown in FIG. 11g, which is a cross section taken along line Q-Q of FIG. 11r. Semiconductor layer 916 can be formed in a variety of manners and, in one embodiment, is deposited using atomic layer deposition techniques.

Figure 11S:
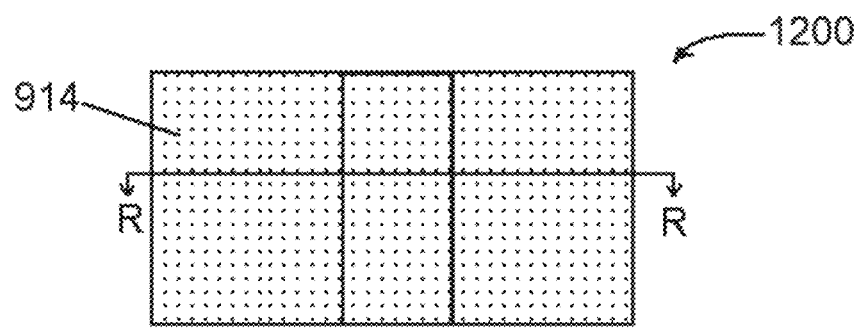

At step 1040, dielectric layer 914 is formed as shown in FIG. 11h, which is a cross section taken along line R-R of FIG. 11s. Dielectric layer 914 is formed over semiconductor layer 916. The selection of the material for dielectric layer 914 is not particularly limited and dielectric layer 914 can be any suitable material with a high dielectric constant as will be apparent to those of skill in the art.

Figure 11T:
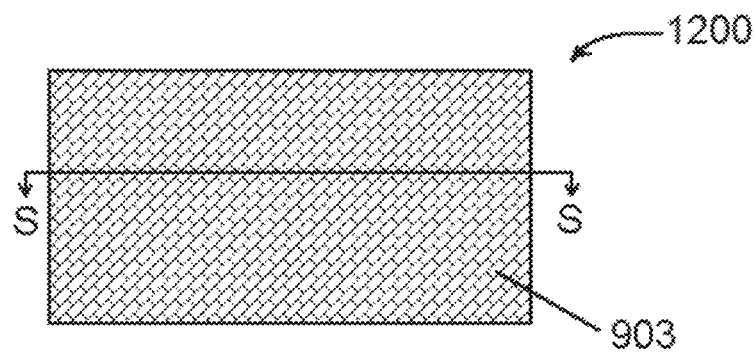

At step 1045, (optional) gate tuning layer 922 can be formed over dielectric layer 914, and gate contact 903 is formed over gate tuning layer 922. Gate tuning layer 922 and gate contact 903 can be formed in a variety of manners, as will be apparent to those of skill in the art, including via an atomic layer deposition technique. If gate tuning layer 922 is not present, gate contact 903 is formed on dielectric layer 914 directly. The results of step 1045 are illustrated in FIG. 11i, which is a cross section taken along line S-S of FIG. 11t.

Figure 11U:
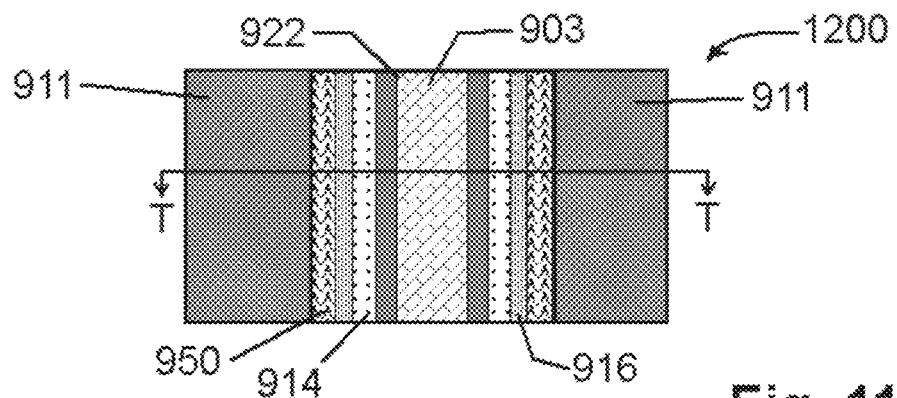
Figure 11V:
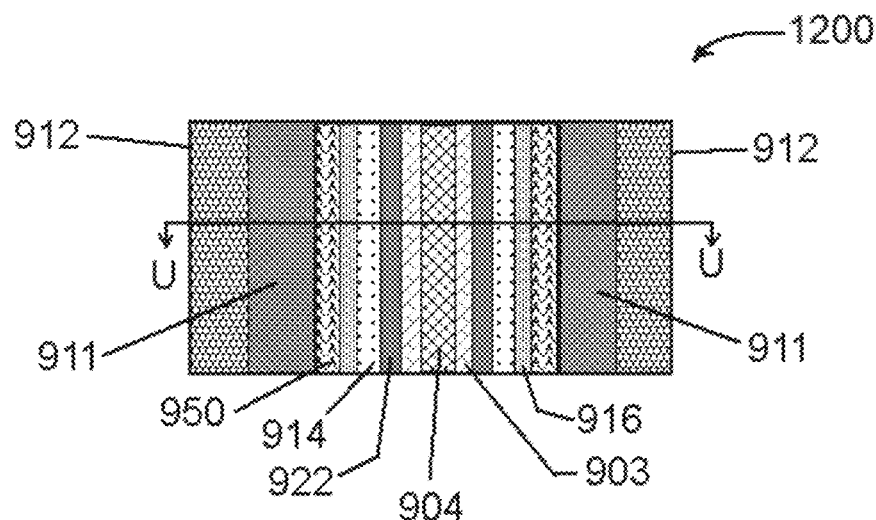

At step 1050, unwanted material from the various formed layers is removed to expose the underlying layers/features as shown in FIG. 11j, which is a cross section taken along line T-T of FIG. 11u. As shown, drain contact 911, source-channel interfacial member 950, semiconductor layer 916, dielectric layer 914, gate tuning layer 922 and gate contact 903 are appropriately exposed. The method of removing unwanted material from the various layers is not particularly limited and can be achieved in a variety of manners as will be apparent to those of skill in the art, including mechanical polishing, wet chemical etching, dry chemical etching, atomic layer etching, etc.

At step 1055, drain electrode 912 and gate electrode 904 are formed. In the embodiment shown in FIG. 11k, which is a cross section taken along line U-U of FIG. 11v, drain electrode 912 and gate electrode 904 can be deposited and patterned by using a masking approach. However, the method used to form drain electrode 912 and gate electrode 904 is not particularly limited and a variety of suitable methods will be apparent to those of skill in the art.

Figure 12A:
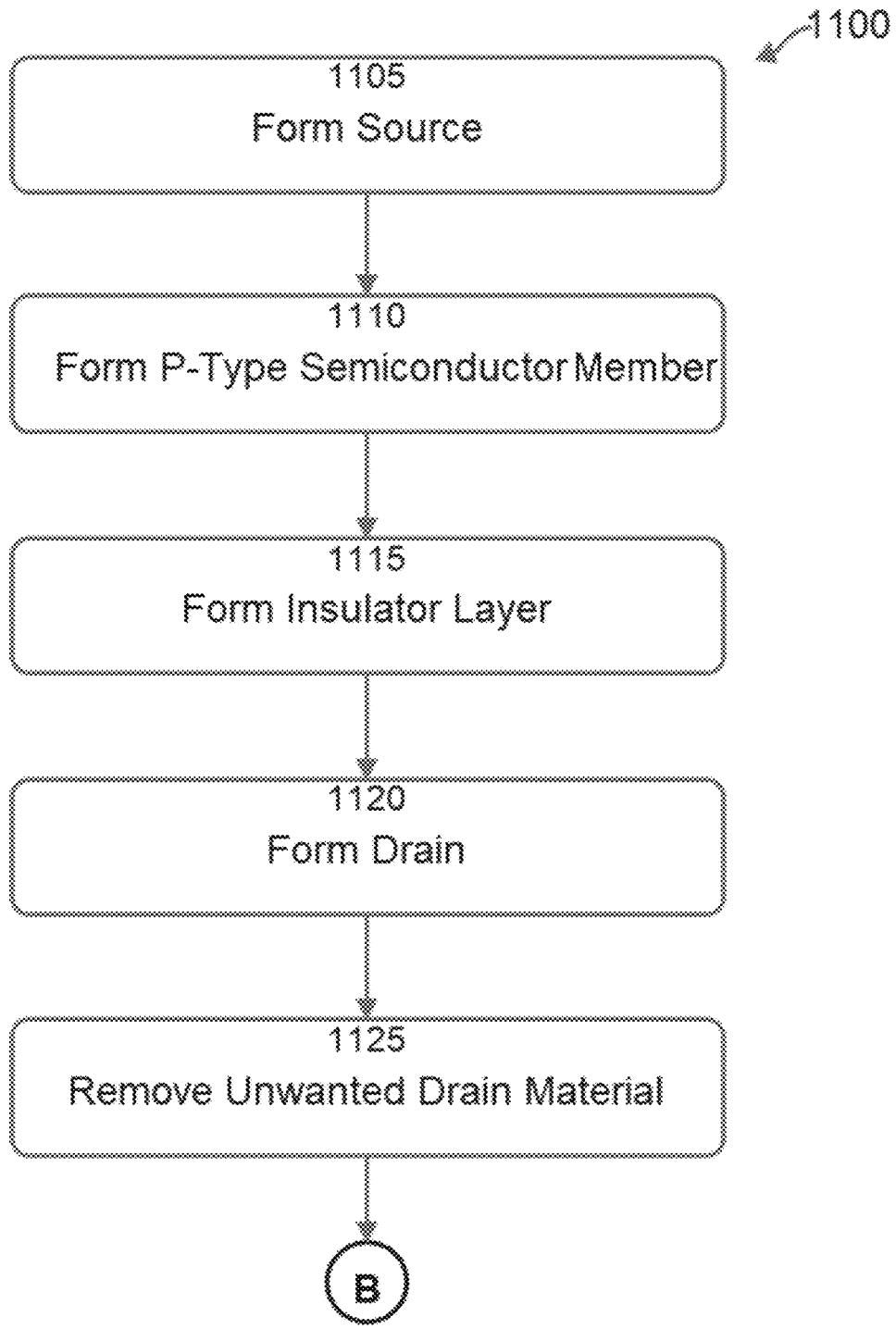
FIGS. 12a and 12b are a flow chart of a method of fabricating a TFT according to another embodiment of the present invention.
Figure 12B:
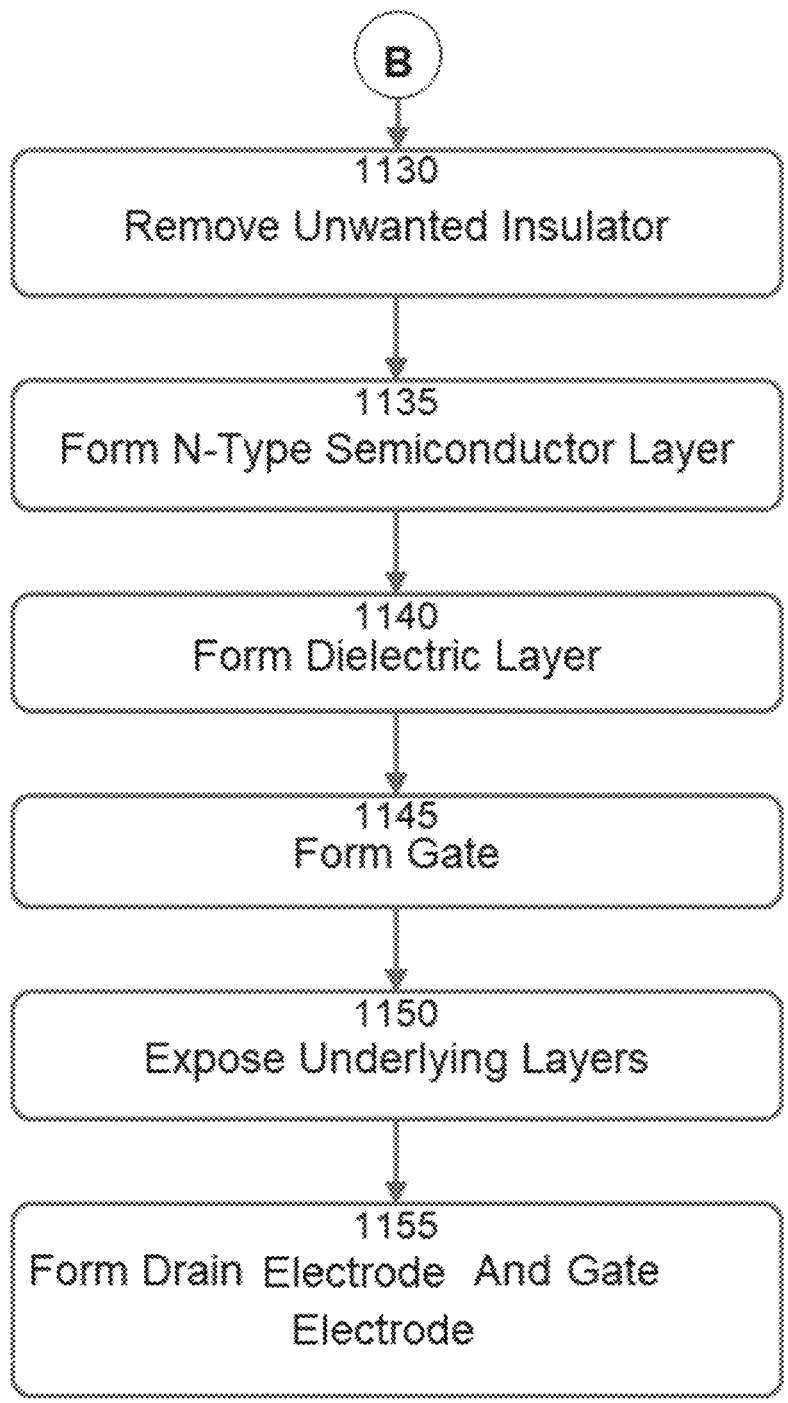

FIGS. 12a and 12b show a flow chart of a method 1100 of manufacturing or fabricating another embodiment of a TFT 1300, similar to TFT 900b discussed above, in accordance with the present invention. Method 1100 is described with reference to FIGS. 13a through 13v.

Figure 13A:
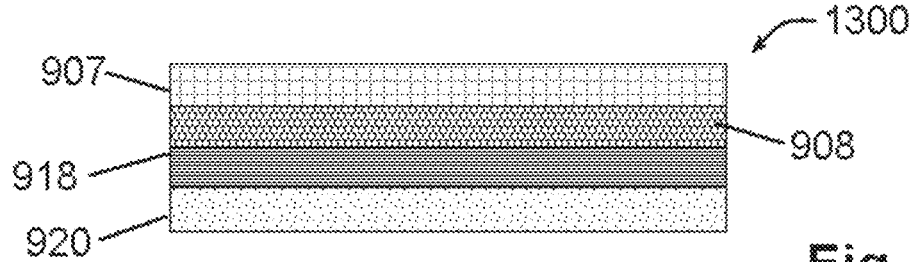
FIGS. 13a to 13k are cross-sectional views of a TFT during fabrication, according to the method of FIGS. 12a and 12b.
Figure 13B:
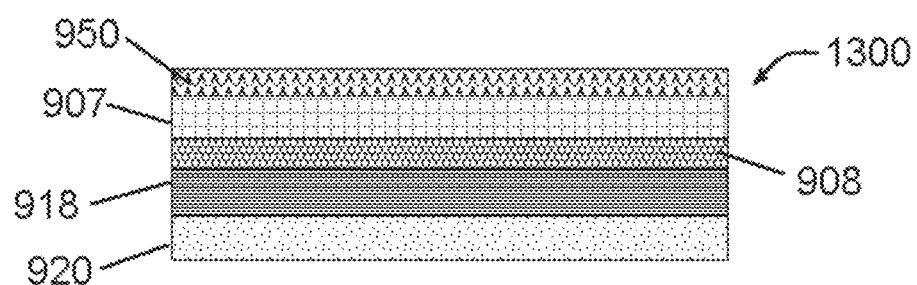

Method 1100 begins with a substrate 920 on which an insulation layer 918 has been formed. At step 1105 source electrode 908 and source contact 907 are formed on insulation layer 918, as shown in FIG. 13a, which is a cross section taken along line BL-BL of FIG. 13l. As will be apparent to those of skill in the art, source electrode 908 and source contact 907 can be the same component, if formed of the same material, Step 1105 is analogous to step 1005 of FIG. 10, and FIGS. 13a and 13l are analogous to FIGS. 11a and 11l, respectively.

At step 1110, p-type semiconductor member 950 is formed on source contact 907. As shown in FIG. 13b, which is a cross section taken along line BM-BM of FIG. 13m, source-channel interfacial member 950 is formed as a layer over the entire upper surface of source contact 907. Source-channel interfacial member 950 can be formed in a variety of manners and in some embodiments it is deposited using an atomic layer deposition technique, but the method of forming source-channel interfacial member 950 is not particularly limited and can, for example, be formed by catalyzing a metal surface of source contact 907 to form a suitable metal oxide or any other appropriate method as will be apparent to those of skill in the art.

Figure 13C:
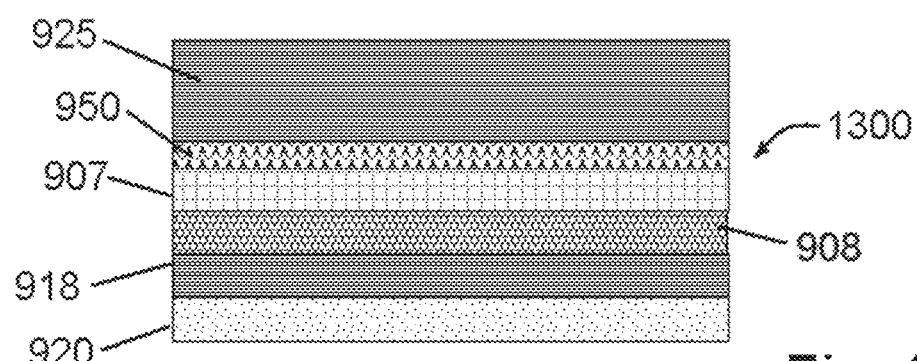
Figure 13D:
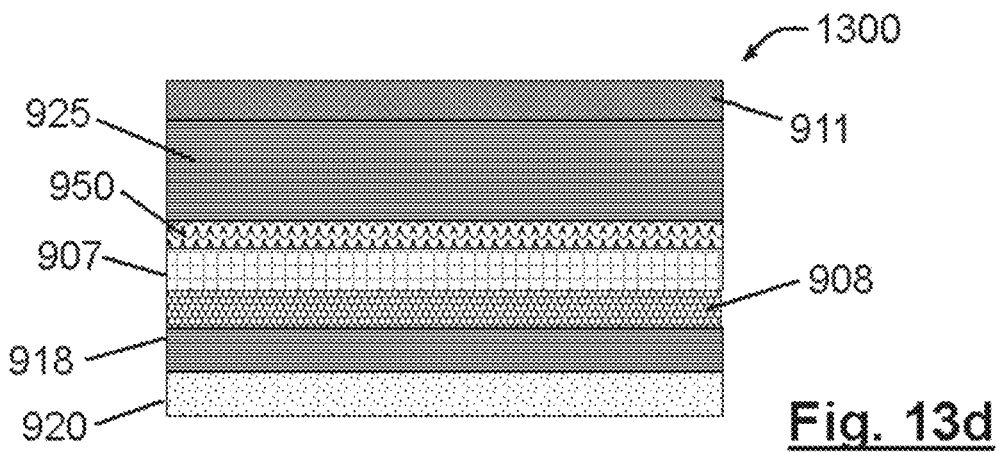
Figure 13E:
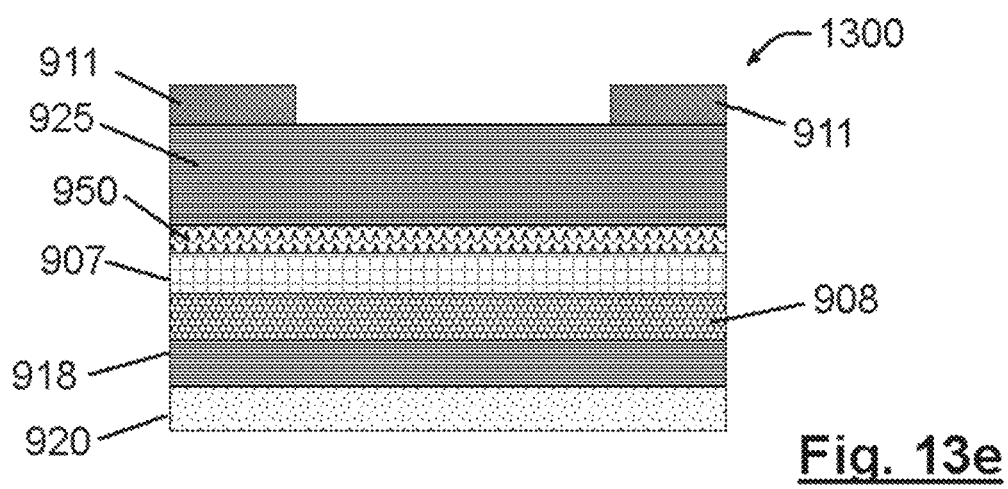
Figure 13F:
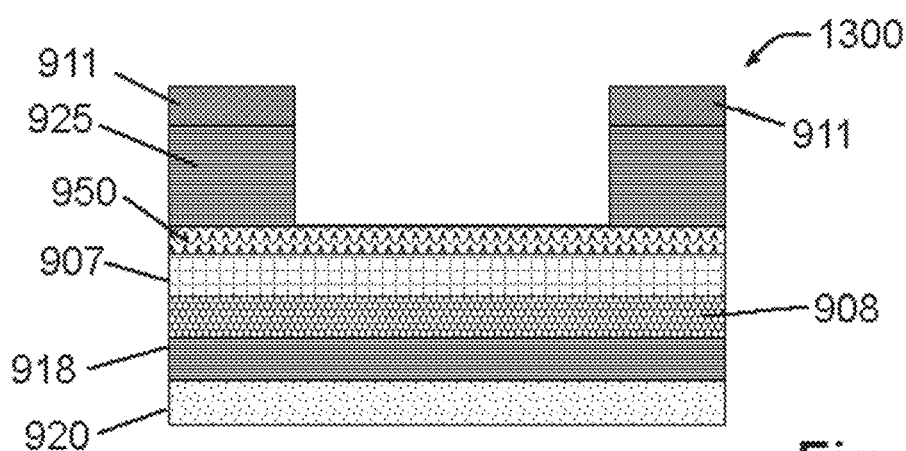
Figure 13G:
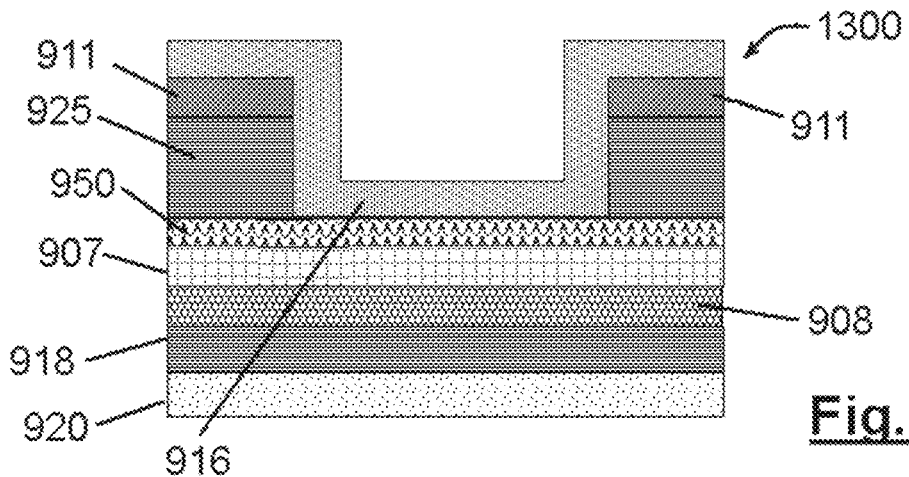
Figure 13H:
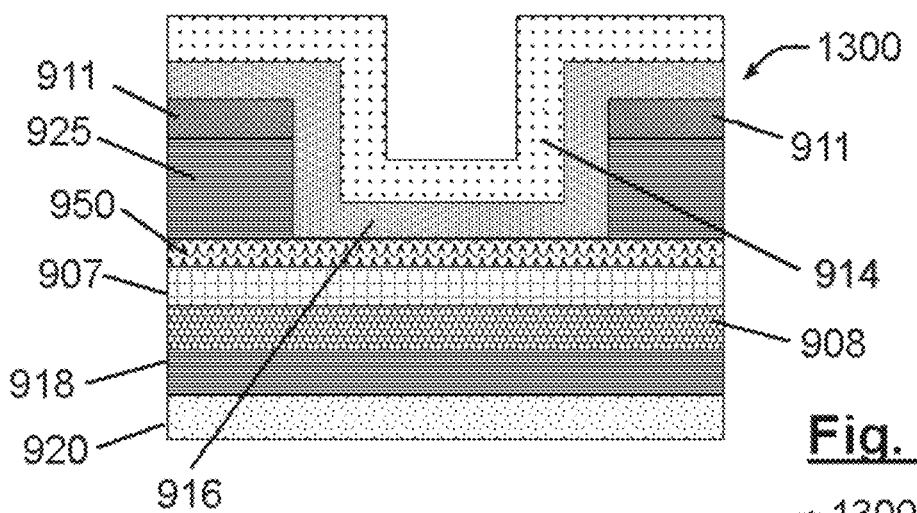
Figure 13I:
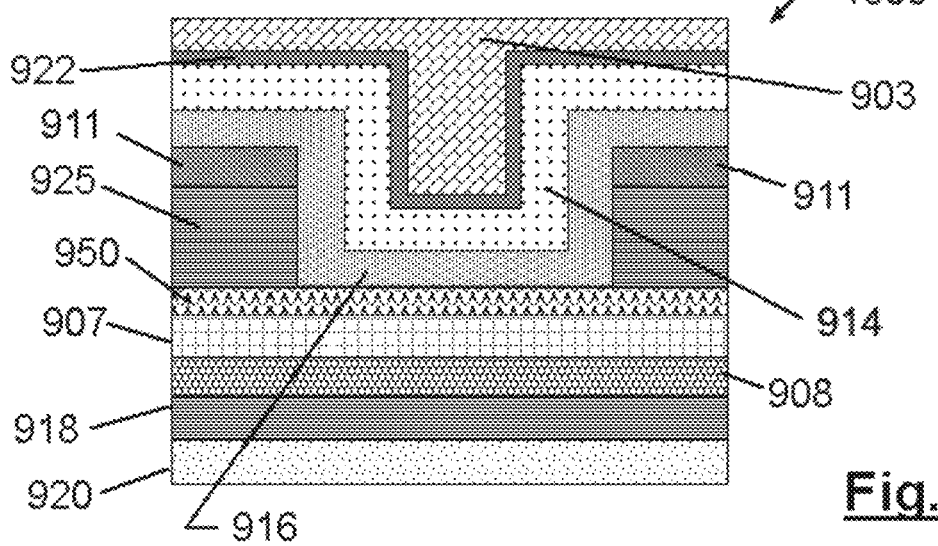
Figure 13J:
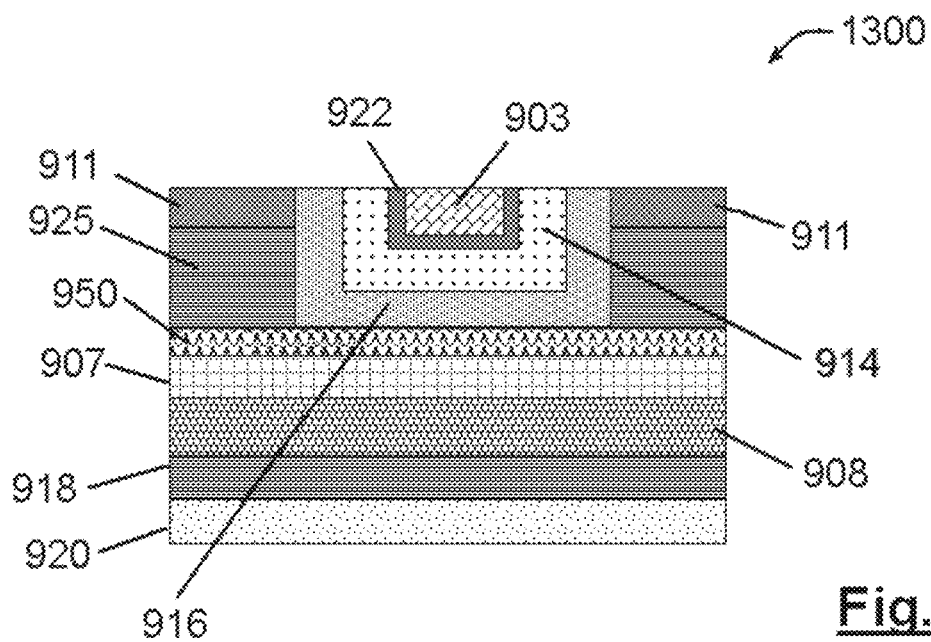
Figure 13K:
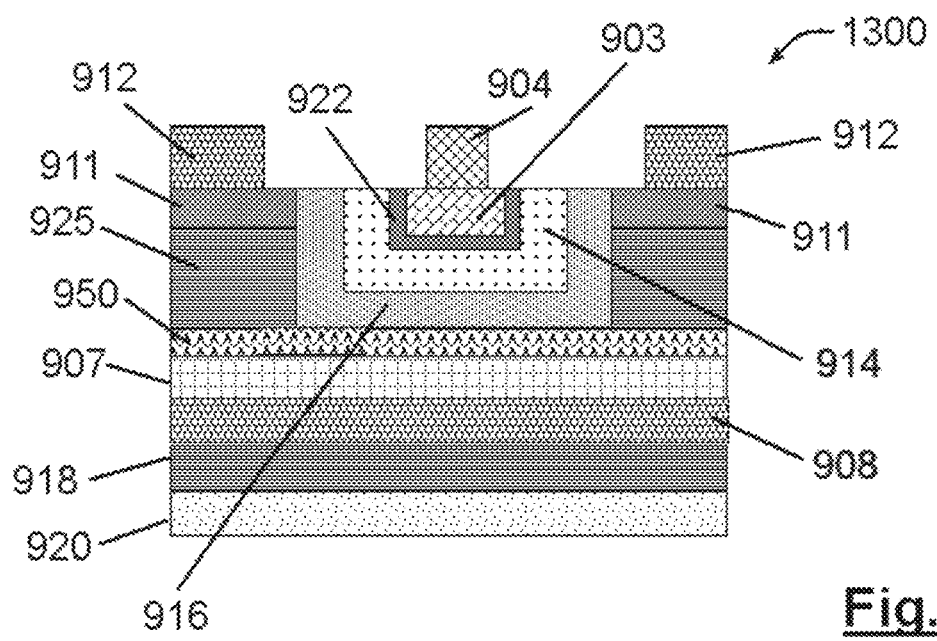
Figure 13L:
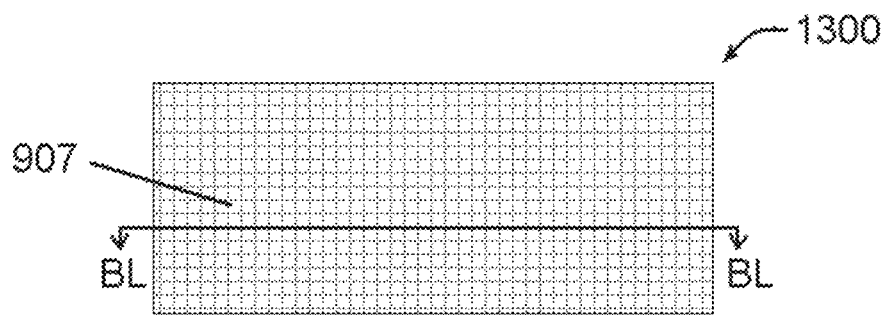
FIGS. 13l to 13v are top views of TFTs of FIGS. 13a to 13k, respectively.
Figure 13M:
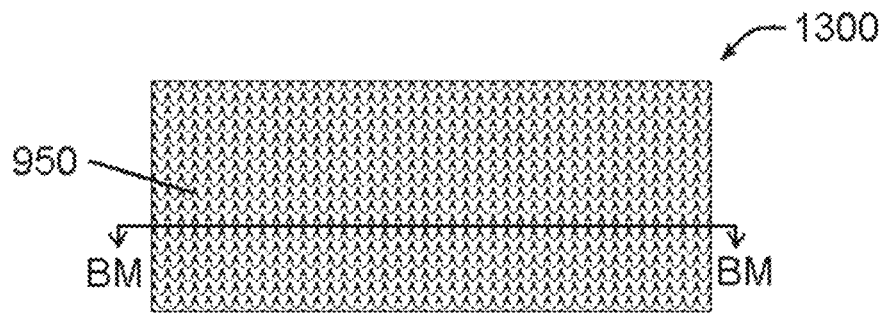
Figure 13N:
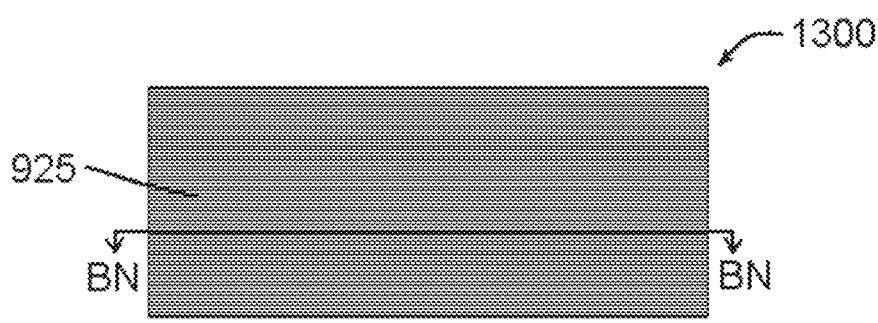

At step 1115, a second insulation layer 925 is formed on source-channel interfacial member 950 as shown in FIG. 13c, which is a cross section taken along line BN-BN of FIG. 13n. In some embodiments, second insulation layer 925 is deposited using spin coating of polymers, but the method of forming second insulation layer 925 is not particularly limited and second insulation layer 925 can, for example, be deposited using chemical vapor deposition ("CVD") of dielectrics or any other suitable method as will be apparent to those of skill in the art.

Figure 13O:
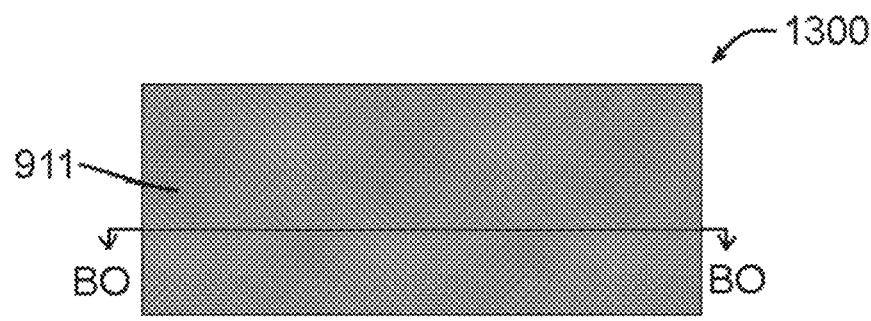

At step 1120, drain contact 911 is formed. As shown in FIG. 13d, which is a cross section taken along line BO-BO of FIG. 13o, drain contact 911 is formed on the entire upper surface of second insulation layer 925. Again, the method of forming drain contact 911 is not particularly limited and suitable methods will be apparent to those of skill in the art.

Figure 13P:
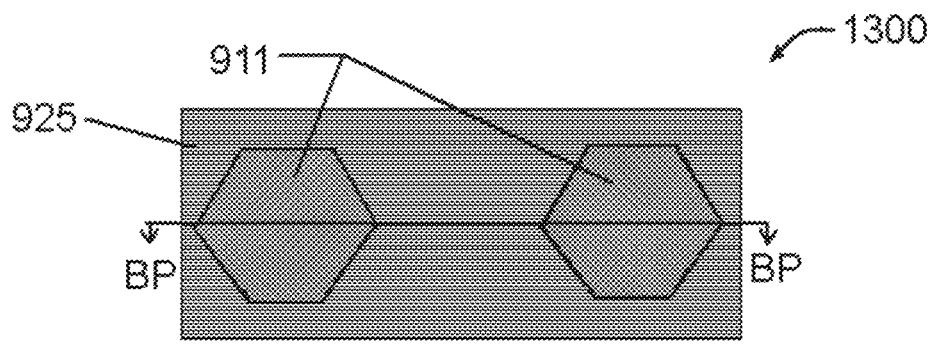

At step 1125, unwanted material is removed from drain contact 911, as shown in FIG. 13e, which is a cross section taken along line BP-BP of FIG. 13p. The method of removing unwanted material from drain contact 911 is not particularly limited. Further, if desired the unwanted material can be removed by etching, or the like, so that drain contact 911 can be formed in a pattern, such as the illustrated hexagon pattern or a stripe pattern (not shown), etc., in order to improve packing density of the resulting TFT.

Figure 13Q:
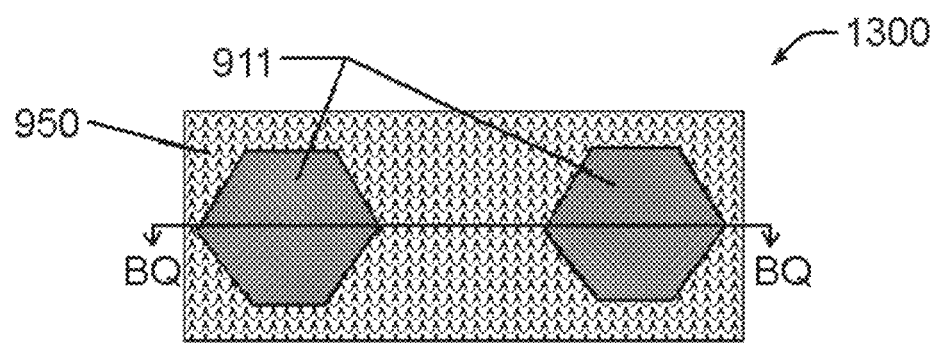

At step 1130, unwanted material is removed from second insulation layer 925, as shown in FIG. 13f, which is a cross section taken along line BQ-BQ of FIG. 13q. As shown, second insulation layer 925 is removed down to source-channel interfacial member 950.

Figure 13R:
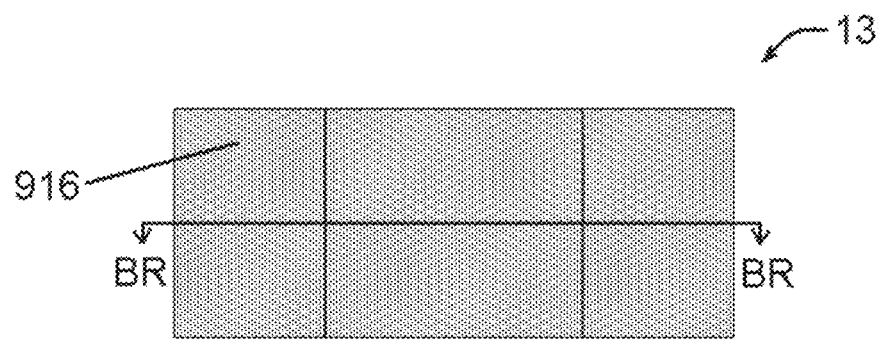

Steps 1135 to 1155 of method 1100 are analogous to steps 1035 to 1055 of method 1000, described above. At step 1135, as shown in FIG. 13g, which is a cross section taken along line BR-BR of FIG. 13r, an n-type semiconductor layer 916 is formed over source-channel interfacial member 950. N-type semiconductor layer 205 can be formed in a variety of manners, as will be apparent to those of skill in the art, including by an atomic layer deposition technique.

Figure 13S:
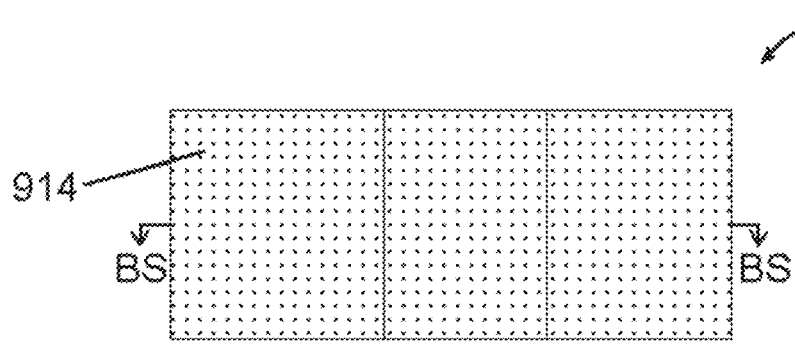

At step 1140, a dielectric layer 914 is formed over semiconductor layer 916. This is shown in FIG. 13h which is a cross section taken along line BS-BS of FIG. 13s. Again, dielectric layer 914 can be formed in a variety of suitable manners, as will be apparent to those of skill in the art.

Figure 13T:
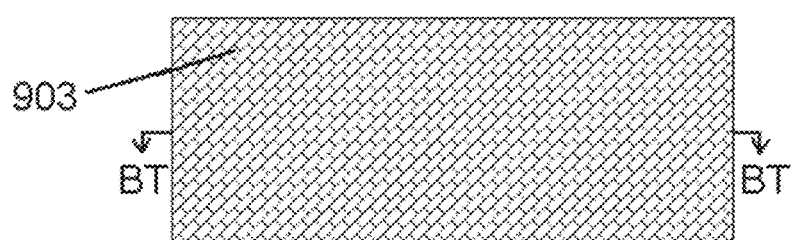

At step 1145, gate contact 903 is formed over dielectric layer 914, as shown in FIG. 13i, which is a cross section taken along line BT-BT of FIG. 13t. As is also shown, if desired an optional gate tuning layer 922 can be formed on dielectric layer 914 before forming gate contact 903. Gate tuning layer 922 and gate contact 903 can be formed by any suitable process, as will occur to those of skill in the art, such as by atomic layer deposition techniques.

Figure 13U:
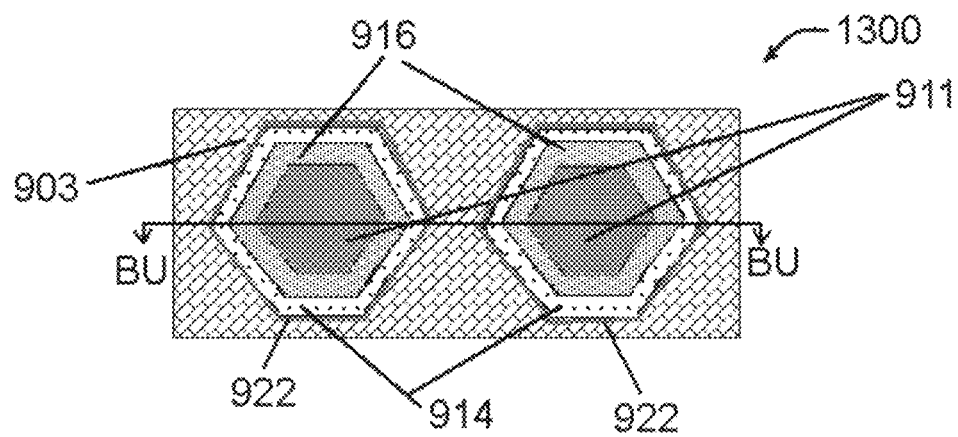
Figure 13V:
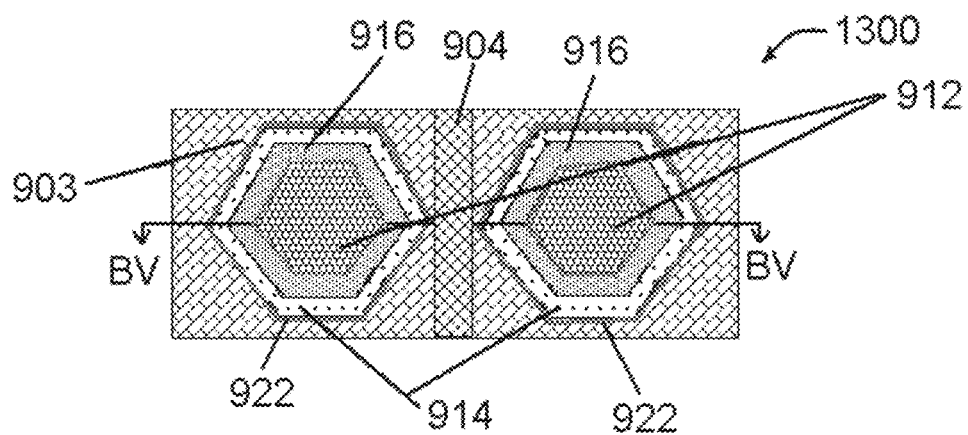

At step 1150, TFT 1300 is processed to remove unwanted material to expose underlying layers and features as shown in FIG. 13j, which is a cross section taken along line BU-BU of FIG. 13u. The material which is removed to expose the layers and features of FIG. 13j can be removed in any suitable manner, such as by mechanical polishing of TFT 1300. In the illustrated embodiment, the underlying layers become exposed and form a hexagonal pattern.

At step 1155, drain electrode 912 and gate electrode 904 are formed. As shown in FIG. 13k, which is a cross section taken along line BV-BV of FIG. 13v, if desired drain electrode 912 and gate electrode 904 can be patterned, via a masking process, in a hexagonal, striped or other pattern.

As will now be apparent, the present invention comprises a variety of embodiments of novel semiconductor devices. In particular, the present invention discloses TFTs with improved performance, even when fabricated at sub 200 nm channel dimensions.

Another contemplated advantage of semiconductor devices in accordance with embodiments of the present invention is their ability to be manufactured in Back End of Line ("BEOL") semiconductor fabrication processes.

As is known to those of skill in the art, semiconductor fabrication processes are often split into Front End of Line ("FEOL") and Back End of Line processes. Conventionally, the transistors, capacitors, resistors and inductors of an integrated circuit are first formed on a wafer by FEOL processes. Once these devices have been fabricated on a wafer, it is then processed with BEOL processes where metalization layers and bonding sites are formed.

Conventionally, once a wafer (or other substrate) has completed FEOL processing, it has generally not been possible to add additional devices to the wafer during BEOL processes, as subjecting the wafer to the temperatures which are required for conventional semiconductor device fabrication would destroy the semiconductor structures and devices already on the wafer which were formed by the FEOL processes.

Recently, attempts have been made to fabricate TFTs as a BEOL process using Indium Gallium Zinc Oxide ("IGZO") as the semiconductor/channel material. While some success has been achieved with such devices, they tend to not perform as well as desired, generally having low threshold voltages, leading to high leakage levels/poor 'OFF' characteristics. Further, the processes used to fabricate the IGZO devices have proven to be difficult to control and the resulting devices are fragile and it can be difficult to have them survive other BEOL processes, such as annealing.

In contrast, TFTs in accordance with embodiments of the present invention can also be fabricated with techniques and processes which will not damage previously fabricated FEOL devices or structures but such TFTs have been shown to perform well, even at semiconductor/channel lengths of less than 200 nm, and to not be damaged by other BEOL processes.

As described in detail above, TFTs in accordance with embodiments of the present invention employ six basic fabrication processes: Source Formation; Drain Formation; Gate Formation; Semiconductor Formation; Dielectric/Insulator Formation; and Source-Channel Interfacial Member Formation—each of which typically can be achieved in several possible ways. Selection of one or more appropriate alternatives for each of these fabrication processes, for use to fabricate BEOL TFTs or TFTs created in FEOL or alternative processes, is within the normal skills of those of skill in the art.

As an example, in deciding on how to fabricate a TFT in accordance with the present invention and wherein it is desired to not exceed a temperature of three hundred degrees centigrade during the fabrication process, it can be decided that: Source formation, Drain Formation and Gate formation will be achieved by sputtering and patterning; Semiconductor layer formation will be achieved by atomic layer deposition; Dielectric/Insulator formation will be achieved by atomic layer deposition; and Source-Channel Interfacial Member formation can be achieved by oxidation of the source contact (if the material is an oxidizable metal) or by sputtering a degeneratively doped monoatomic semiconductor layer, such as Germanium or Silicon. As will be apparent, each of these selected fabrication technologies can be performed at temperatures below three hundred degrees centigrade and will therefore not affect devices and structures which were previously fabricated in FEOL processes.

As will also now be apparent, the present invention provides novel thin film semiconductor switching devices which have good performance, even when manufactured with semiconductor/channel lengths of less than 1000 nm, and in particular with semiconductor/channel lengths of less than 200 nm. Manufacturing techniques and methods for the novel devices are also taught and these techniques and methods also allow the novel devices to be manufactured as BEOL devices.

The above-described embodiments of the invention are intended to be examples of the present invention and alterations and modifications may be effected thereto, by those of skill in the art, without departing from the scope of the invention which is defined solely by the claims appended hereto.

We claim:

1. A vertical thin film transistor comprising:
a substantially planar substrate;
an insulating layer formed on the substrate;
a source formed on the insulating layer
a second insulating layer formed on the source, the second insulating layer forming a vertical well having an inner surface;
a source-channel interfacial member formed on the inner surface of the vertical well and the source;
an n-type semiconductor material formed on the source-channel interfacial member, such that the source is electrically connected to the n-type semiconductor material by the source-channel interfacial member;
a gate dielectric layer formed over the n-type semiconductor material;
a gate formed over the dielectric layer; and
a drain formed on the insulating layer and in electrical contact with the n-type semiconductor material, wherein when the transistor is in an on state current can flow from the source to the drain through the source-channel interfacial member and through a channel formed in the n-type semiconductor material.

2. The vertical thin film transistor according to claim 1 wherein the n-type semiconductor material is selected from the group comprising zinc oxide, tin oxide, indium oxide, indium gallium zinc oxide, gallium oxide and germanium oxide and combinations thereof.

3. The vertical thin film transistor according to claim 1 wherein the transistor is formed as a hexagonal prism.

4. The vertical thin film transistor according to claim 1 wherein the transistor is formed as a rectangular parallelepiped.

5. The vertical thin film transistor according to claim 1 wherein the transistor is formed on a substrate which covers at least a second vertical thin film transistor.

6. The vertical thin film transistor according to claim 1 wherein the source-channel interfacial member is a p-type semiconductor.

7. The vertical thin film transistor according to claim 1 wherein the p-type semiconductor is an oxide formed by catalytic growth of the source.

8. The vertical thin film transistor according to claim 1 wherein the source-channel interfacial member is a piezoelectric induced dipole.

9. The vertical thin film transistor according to claim 1 wherein the source-channel interfacial member is a controllable tunnelling barrier.

10. A vertical thin film transistor comprising:
a substantially planar substrate;
an insulating layer formed on the substrate;
a source formed on the insulating layer;
a source-channel interfacial member formed on the source;
a second insulating layer formed on the source-channel interfacial member and forming a vertical well having an inner surface extending upward from the source-channel interfacial member;
an n-type semiconductor material formed on inner surface of the well and the source-channel interfacial member, wherein the source-channel interfacial member electrically connects the source to the n-type semiconductor material;
a gate dielectric layer formed over the n-type semiconductor material;
a gate formed over the dielectric layer; and
a drain formed on the second insulating layer in electrical contact with the n-type semiconductor material wherein, when the transistor is in an on state current can flow from the source to the drain through the source-channel interfacial member and through a channel formed in the n-type semiconductor material.

11. The vertical thin film transistor according to claim 10 wherein the n-type semiconductor material is selected from the group comprising zinc oxide, tin oxide, indium oxide, indium gallium zinc oxide, gallium oxide and germanium oxide and combinations thereof.

12. The vertical thin film transistor according to claim 10 wherein the transistor is formed as a hexagonal prism.

13. The vertical thin film transistor according to claim 10 wherein the transistor is formed as a rectangular parallelepiped.

14. The vertical thin film transistor according to claim 10 wherein the transistor is formed on a substrate which covers at least a second vertical thin film transistor.

15. The vertical thin film transistor according to claim 10 wherein the source-channel interfacial member is a p-type semiconductor.

16. The vertical thin film transistor according to claim 10 wherein the p-type semiconductor is an oxide formed by catalytic growth of the source.

17. The vertical thin film transistor according to claim 10 wherein the source-channel interfacial member is a piezo-electric induced dipole.

18. The vertical thin film transistor according to claim 10 wherein the source-channel interfacial member is a controllable tunnelling barrier.

19. A thin film transistor comprising:
a substrate;
an insulating layer formed on the substrate;
a source;
a drain formed on the insulating layer and vertically spaced from the source;
an n-type semiconductor material formed on the insulating layer and extending between the source and the drain;
a source-channel interfacial member electrically connecting at least the source to the n-type semiconductor material;
a gate dielectric layer formed over the n-type semiconductor material;
a gate formed over the dielectric layer; and
a second insulating layer, wherein one of the source and the drain are formed on the insulating layer, the second insulating layer is formed on the one of said source and drain, the second insulating layer forming a vertical hollow having an inner surface extending upward from the one of the source and the drain, the source-channel interfacial member forming a layer on the inner surface of the hollow and the portion of the drain within the hollow, the n-type semiconductor material forming a layer on the layer of the source-channel interfacial member, the gate dielectric layer forming a layer on the n-type semiconductor, the gate being formed on the gate dielectric layer and the other of the source and drain being formed on top of the second insulating layer in electrical contact with the source-channel interfacial member and wherein, when the transistor is in an on state current can flow from the source to the drain through the source-channel interfacial member and through a channel formed in the n-type semiconductor material.

20. A thin film transistor comprising:
a substrate;
an insulating layer formed on the substrate;
a source;
a drain formed on the insulating layer and vertically spaced from the source;
an n-type semiconductor material formed on the insulating layer and extending between the source and the drain;
a source-channel interfacial member electrically connecting at least the source to the n-type semiconductor material;
a gate dielectric layer formed over the n-type semiconductor material;
a gate formed over the dielectric layer; and
a second insulating layer and wherein the source is formed on the insulating layer, the source-channel interfacial member is formed on the source, the second insulating layer is formed on the source, the second insulating layer forming a vertical hollow having an inner surface extending upward from the source, the n-type semiconductor material forming a layer on the layer of the source-channel interfacial member and the inner surface of the hollow, the gate dielectric layer forming a layer on the n-type semiconductor material, the gate being formed on the gate dielectric layer and the drain being formed on top of the second insulating layer and in electrical contact with the n-type semiconductor material and wherein, when the transistor is in an on state current can flow from the source to the drain through the source-channel interfacial member and through a channel formed in the n-type semiconductor material.

21. A thin film transistor comprising:
a substrate;
an insulating layer formed on the substrate;
a source;
a drain formed on the insulating layer and vertically spaced from the source;
an n-type semiconductor material formed on the insulating layer and extending between the source and the drain;
a source-channel interfacial member electrically connecting at least the source to the n-type semiconductor material;
a gate dielectric layer formed over the n-type semiconductor material;
a gate formed over the dielectric layer; and
a second insulating layer and wherein the drain is formed on the insulating layer, the second insulating layer is formed on the drain, the second insulating layer forming a vertical hollow having an inner surface extending upward from the drain, the second insulating layer forming a vertical hollow extending upward from the drain and having an inner surface, the n-type semiconductor material forming a layer on the inner surface of the vertical hollow and the drain, the gate dielectric layer forming a layer on the n-type semiconductor and the gate being formed on the gate dielectric layer, the source and the source-channel interfacial material being formed on top of the second insulating layer such that the source-channel interfacial member electrically connects the source to the n-type semiconductor material and wherein, when the transistor is in an on state current can flow from the source to the drain through the source-channel interfacial member and through a channel formed in the n-type semiconductor material.

22. A vertical thin film transistor comprising:
a substantially planar substrate;
an insulating layer formed on the substrate;
a drain formed on the insulating layer;

a second insulating layer formed on the drain and forming a vertical well having an inner surface extending upward from the drain;
an n-type semiconductor material formed on inner surface of the well and the drain;
a gate dielectric layer formed over the n-type semiconductor material;
a gate formed over the dielectric layer; and
a source and a source-channel interfacial member formed on the second insulating layer, the source-channel interfacial member electrically connecting the source to the n-type semiconductor material wherein, when the transistor is in an on state current can flow from the source to the drain through the source-channel interfacial member and through a channel formed in the n-type semiconductor material.

23. The vertical thin film transistor according to claim 22 wherein the n-type semiconductor material is selected from the group comprising zinc oxide, tin oxide, indium oxide, indium gallium zinc oxide, gallium oxide and germanium oxide and combinations thereof.

24. The vertical thin film transistor according to claim 22 wherein the transistor is formed as a hexagonal prism.

25. The vertical thin film transistor according to claim 22 wherein the transistor is formed as a rectangular parallelepiped.

26. The vertical thin film transistor according to claim 22 wherein the transistor is formed on a substrate which covers at least a second vertical thin film transistor.

27. The vertical thin film transistor according to claim 22 wherein the source-channel interfacial member is a p-type semiconductor.

28. The vertical thin film transistor according to claim 22 wherein the p-type semiconductor is an oxide formed by catalytic growth of the source.

29. The vertical thin film transistor according to claim 22 wherein the source-channel interfacial member is a piezoelectric induced dipole.

30. The vertical thin film transistor according to claim 22 wherein the source-channel interfacial member is a controllable tunnelling barrier.

* * * * *

UNITED STATES PATENT AND TRADEMARK OFFICE
CERTIFICATE OF CORRECTION

Page 1 of 2

PATENT NO. : 11,949,019 B2
APPLICATION NO. : 18/384066
DATED : April 2, 2024
INVENTOR(S) : Douglas W. Barlage et al.

It is certified that error appears in the above-identified patent and that said Letters Patent is hereby corrected as shown below:

In the Specification

Column 1, Line 15: delete "relaters" and insert --relates-- after "invention", therefor.
Column 2, Line 12: delete "gate" and insert --drain-- after "the", therefor.
Column 5, Line 17: delete "107" and insert --108-- before "and a source", therefor.
Column 5, Line 18: delete "108" and insert --107-- after "contact", therefor.
Column 5, Line 18: delete "111" and insert --112-- after "a drain electrode", therefor.
Column 5, Line 19: delete "112" and insert --111-- after "a drain contact", therefor.
Column 5, Line 20: delete "107" and insert --108-- after "source electrode", therefor.
Column 5, Line 20: delete "106" and insert --107-- after "and source contact", therefor.
Column 5, Line 22: delete "106" and insert --107-- after "source contact", therefor.
Column 5, Line 23: delete "107" and insert --108-- before "can be", therefor.
Column 5, Line 24: delete "107" and insert --108-- before "to", therefor.
Column 5, Line 26: delete "111" and insert --112-- after "and drain electrode", therefor.
Column 5, Line 26: delete "112" and insert --111-- before "can similarly", therefor.
Column 5, Line 36: delete "108" and insert --107-- before "and drain", therefor.
Column 5, Line 37: delete "112" and insert --111-- after "contact", therefor.
Column 5, Line 38: delete "a" and insert --an-- before "n-type", therefor.
Column 6, Line 57: insert --be-- after "can".
Column 7, Line 46: delete "complimentary" and insert --complementary-- before "excess negative charge", therefor.
Column 9, Line 10: delete "complimentary" and insert --complementary-- before "excess", therefor.
Column 9, Line 21: delete "complimentary" and insert --complementary-- after "of", therefor.
Column 10, Line 14: delete "200c" and insert --200d-- after "In TFT", therefor.
Column 10, Line 16: delete "200c" and insert --200d-- after "raises the thereshold voltage of TFT", therefor.
Column 10, Line 50: insert --and-- after "$V_{DS} > 0$".
Column 10, Line 52: insert --and-- after "$V_{DS} > 0$".
Column 10, Line 53: delete "a" after "300".
Column 10, Line 54: insert --and-- after "wherein $V_{DS} > 0$".

Signed and Sealed this
Fifteenth Day of April, 2025

Coke Morgan Stewart
*Acting Director of the United States Patent and Trademark Office*

CERTIFICATE OF CORRECTION (continued)
U.S. Pat. No. 11,949,019 B2

Column 10, Line 54: delete "< $V_{Threshold}$" and insert --$\approx$ 0V-- after "VGS".
Column 11, Line 37: insert --402-- before "of TFT 400", therefor.
Column 11, Line 45: insert --and-- after "wherein $V_{DS} > 0$".
Column 11, Line 52: insert --and-- after "wherein $V_{DS} > 0$".
Column 12, Line 4: delete "5e" and insert --5d-- before "5a through", therefor.
Column 12, Line 8: delete "507" and insert --506-- after "and source electrode", therefor.
Column 12, Line 8: delete "506" and insert --507-- after "source contact", therefor.
Column 12, Line 9: delete "511" and insert --510-- before ", drain contact", therefor.
Column 12, Line 9: delete "510" and insert --511-- after "drain contact", therefor.
Column 12, Line 9: delete "503" and insert --502-- after "gate electrode", therefor.
Column 12, Line 10: delete "502" and insert --503-- before ", dielectric layer", therefor.
Column 12, Line 18: delete "506" and insert --507-- after "contact", therefor.
Column 12, Line 19: delete "506" and insert --507-- after "contact", therefor.
Column 12, Line 27: delete "stage" and insert --state-- after "0V", therefor.
Column 12, Line 32: delete "a" after "800".
Column 12, Line 45: delete "contact" after "711".
Column 13, Line 25: insert --which are formed on an insulating layer 818 in turn formed on a substrate 820-- after "811", therefor.
Column 15, Line 1: delete "990a" and insert --900a-- before "TFTs", therefor.
Column 17, Line 32: delete "semiconductor" and insert --source-channel interfacial-- before "member 950 is", therefor.